US010310009B2

(12) United States Patent
Thompson et al.

(10) Patent No.: US 10,310,009 B2
(45) Date of Patent: Jun. 4, 2019

(54) WAFER SCALE TEST INTERFACE UNIT AND CONTACTORS

(71) Applicant: Nuvotronics, Inc., Radford, VA (US)

(72) Inventors: Rick L. Thompson, Amherst, NH (US); Kenneth Vanhille, Cary, NC (US); Anatoliy O. Boryssenko, Belchertown, MA (US); Jean Marc Rollin, Chapel Hill, NC (US)

(73) Assignee: NUVOTRONICS, INC, Radford, VA (US)

( * ) Notice: Subject to any disclaimer, the term of this patent is extended or adjusted under 35 U.S.C. 154(b) by 0 days.

(21) Appl. No.: 15/111,252

(22) PCT Filed: Jan. 16, 2015

(86) PCT No.: PCT/US2015/011789
§ 371 (c)(1),
(2) Date: Jul. 13, 2016

(87) PCT Pub. No.: WO2015/109208
PCT Pub. Date: Jul. 23, 2015

(65) Prior Publication Data
US 2016/0341790 A1 Nov. 24, 2016

Related U.S. Application Data

(60) Provisional application No. 61/928,767, filed on Jan. 17, 2014.

(51) Int. Cl.
G01R 31/28 (2006.01)
G01R 1/067 (2006.01)
G01R 1/073 (2006.01)

(52) U.S. Cl.
CPC ...... *G01R 31/2889* (2013.01); *G01R 1/06716* (2013.01); *G01R 1/06722* (2013.01); *G01R 1/07307* (2013.01); *G01R 1/07357* (2013.01)

(58) Field of Classification Search
CPC ............ G01R 31/2889; G01R 1/06716; G01R 1/06722; G01R 1/07307; G01R 1/07357
(Continued)

(56) References Cited

U.S. PATENT DOCUMENTS 2,743,505 A 5/1956 George
2,812,501 A 11/1957 Sommers
(Continued)

FOREIGN PATENT DOCUMENTS

CA 2055116 A1 5/1992
DE 3623093 A1 1/1988
(Continued)

OTHER PUBLICATIONS

International Search Report and Written Opinion for PCT/US2015/011789 dated Apr. 10, 2015.
(Continued)

*Primary Examiner* — Melissa J Koval
*Assistant Examiner* — Trung Nguyen
(74) *Attorney, Agent, or Firm* — Niels Haun; Dann, Dorfman, Herrell & Skillman, P.C.

(57) ABSTRACT

Devices and methods for multilayer packages, antenna array feeds, test interface units, connectors, contactors, and large format substrates. The device comprising a 3D coaxial distribution network structure including a plurality of coaxial transmission lines separated by a first pitch at the input and a second, wider pitch at the output thereof.

21 Claims, 25 Drawing Sheets

(58) Field of Classification Search
USPC .............. 324/500, 538, 757.03, 762.05, 437, 324/754.01–756.05, 758.01, 690
See application file for complete search history.

(56) References Cited

U.S. PATENT DOCUMENTS

| | | |
|---|---|---|
| 2,914,766 A | 11/1959 | Butler |
| 2,997,519 A | 8/1961 | Hines |
| 3,157,847 A | 11/1964 | Williams |
| 3,309,632 A | 3/1967 | Trudeau |
| 3,311,966 A | 4/1967 | Henry |
| 3,335,489 A | 8/1967 | Grant |
| 3,352,730 A | 11/1967 | Murch |
| 3,464,855 A | 9/1969 | Quintana |
| 3,517,847 A | 6/1970 | Guala |
| 3,526,867 A | 9/1970 | Keeler |
| 3,537,043 A | 10/1970 | Smith |
| 3,560,896 A | 2/1971 | Essinger |
| 3,577,105 A | 5/1971 | Jones, Jr. |
| 3,598,107 A | 8/1971 | Ishikawa |
| 3,760,306 A | 9/1973 | Spinner |
| 3,775,844 A | 12/1973 | Parks |
| 3,789,129 A | 1/1974 | Ditscheid |
| 3,791,858 A | 2/1974 | McPherson |
| 3,884,549 A | 5/1975 | Wang |
| 3,925,883 A | 12/1975 | Cavalear |
| 3,963,999 A | 6/1976 | Nakajima |
| 4,021,789 A | 5/1977 | Furman |
| 4,033,656 A | 7/1977 | Freehauf |
| 4,075,757 A | 2/1978 | Malm |
| 4,275,944 A | 6/1981 | Sochor |
| 4,348,253 A | 9/1982 | Subbarao |
| 4,365,222 A | 12/1982 | Lampert |
| 4,414,424 A | 11/1983 | Mizoguchi |
| 4,417,393 A | 11/1983 | Becker |
| 4,437,074 A | 3/1984 | Cohen |
| 4,521,755 A | 6/1985 | Carlson |
| 4,539,534 A | 9/1985 | Hudspeth |
| 4,581,301 A | 4/1986 | Michaelson |
| 4,591,411 A | 5/1986 | Reimann |
| 4,641,140 A | 2/1987 | Heckaman |
| 4,647,878 A | 3/1987 | Landis |
| 4,663,497 A | 5/1987 | Reimann |
| 4,673,904 A | 6/1987 | Landis |
| 4,677,393 A | 6/1987 | Sharma |
| 4,684,181 A | 8/1987 | Massit |
| 4,700,159 A | 10/1987 | Jones |
| 4,717,064 A | 1/1988 | Popielarski |
| 4,729,510 A | 3/1988 | Landis |
| 4,771,294 A | 9/1988 | Wasilousky |
| 4,808,273 A | 2/1989 | Hua |
| 4,832,461 A | 5/1989 | Yamagishi |
| 4,853,656 A | 8/1989 | Guillou |
| 4,856,184 A | 8/1989 | Doeling |
| 4,857,418 A | 8/1989 | Schuetz |
| 4,859,806 A | 8/1989 | Smith |
| 4,876,322 A | 10/1989 | Budde |
| 4,880,684 A | 11/1989 | Boss |
| 4,909,909 A | 3/1990 | Florjancic |
| 4,915,983 A | 4/1990 | Lake |
| 4,969,979 A | 11/1990 | Appelt |
| 4,975,142 A | 12/1990 | Iannacone |
| 5,069,749 A | 12/1991 | Gutierrez |
| 5,072,201 A | 12/1991 | Devaux |
| 5,089,880 A | 2/1992 | Meyer |
| 5,100,501 A | 3/1992 | Blumenthal |
| 5,119,049 A | 6/1992 | Heller |
| 5,191,699 A | 3/1993 | Ganslmeier |
| 5,213,511 A | 5/1993 | Sobhani |
| 5,227,013 A | 7/1993 | Kumar |
| 5,235,208 A | 8/1993 | Katoh |
| 5,274,484 A | 12/1993 | Mochizuki |
| 5,299,939 A | 4/1994 | Walker |
| 5,312,456 A | 5/1994 | Reed |
| 5,334,956 A | 8/1994 | Leding |
| 5,381,157 A | 1/1995 | Shiga |
| 5,381,596 A | 1/1995 | Ferro |
| 5,406,235 A | 4/1995 | Hayashi |
| 5,406,423 A | 4/1995 | Hayashi |
| 5,430,257 A | 7/1995 | Lau |
| 5,454,161 A | 10/1995 | Beilin |
| 5,469,072 A | 11/1995 | Williams et al. |
| 5,529,504 A | 6/1996 | Greenstein |
| 5,622,895 A | 4/1997 | Frank |
| 5,633,615 A | 5/1997 | Quan |
| 5,682,062 A | 10/1997 | Gaul |
| 5,682,124 A | 10/1997 | Suski |
| 5,712,607 A | 1/1998 | Dittmer |
| 5,724,012 A | 3/1998 | Teunisse |
| 5,746,868 A | 5/1998 | Abe |
| 5,793,272 A | 8/1998 | Burghartz |
| 5,814,889 A | 9/1998 | Gaul |
| 5,860,812 A | 1/1999 | Gugliotti |
| 5,872,399 A | 2/1999 | Lee |
| 5,903,059 A | 5/1999 | Bertin |
| 5,925,206 A | 7/1999 | Boyko |
| 5,940,674 A | 8/1999 | Sachs |
| 5,961,347 A | 10/1999 | Hsu |
| 5,977,842 A | 11/1999 | Brown |
| 5,990,768 A | 11/1999 | Takahashi |
| 6,008,102 A | 12/1999 | Alford |
| 6,027,630 A | 2/2000 | Cohen |
| 6,054,252 A | 4/2000 | Lundy |
| 6,101,705 A | 8/2000 | Wolfson |
| 6,180,261 B1 | 1/2001 | Inoue |
| 6,183,268 B1 | 2/2001 | Consoli |
| 6,207,901 B1 | 3/2001 | Smith |
| 6,210,221 B1 | 4/2001 | Maury |
| 6,228,466 B1 | 5/2001 | Tsukada |
| 6,232,669 B1 | 5/2001 | Khoury |
| 6,294,965 B1 | 9/2001 | Merrill |
| 6,329,605 B1 | 12/2001 | Beroz |
| 6,350,633 B1 | 2/2002 | Lin |
| 6,388,198 B1 | 5/2002 | Bertin |
| 6,426,637 B1 | 7/2002 | Dang |
| 6,457,979 B1 | 10/2002 | Dove |
| 6,465,747 B2 | 10/2002 | DiStefano |
| 6,466,112 B1 | 10/2002 | Kwon |
| 6,514,845 B1 | 2/2003 | Eng |
| 6,518,165 B1 | 2/2003 | Yoon |
| 6,535,088 B1 | 3/2003 | Sherman |
| 6,538,312 B1 | 3/2003 | Peterson |
| 6,589,594 B1 | 7/2003 | Hembree |
| 6,600,395 B1 | 7/2003 | Handforth |
| 6,603,376 B1 | 8/2003 | Handforth |
| 6,648,653 B2 | 11/2003 | Huang |
| 6,662,443 B2 | 12/2003 | Chou |
| 6,677,248 B2 | 1/2004 | Kwon |
| 6,717,422 B2 | 4/2004 | Akram |
| 6,735,009 B2 | 5/2004 | Li |
| 6,746,891 B2 | 6/2004 | Cunningham |
| 6,749,737 B2 | 6/2004 | Cheng |
| 6,800,360 B2 | 10/2004 | Miyanaga |
| 6,800,555 B2 | 10/2004 | Test |
| 6,827,608 B2 | 12/2004 | Hall |
| 6,850,084 B2 | 2/2005 | Hembree |
| 6,868,214 B1 | 3/2005 | Sakata |
| 6,888,427 B2 | 5/2005 | Sinsheimer |
| 6,889,433 B1 | 5/2005 | Enomoto |
| 6,914,513 B1 | 7/2005 | Wahlers |
| 6,917,086 B2 | 7/2005 | Cunningham |
| 6,943,452 B2 | 9/2005 | Bertin |
| 6,971,913 B1 | 12/2005 | Chu |
| 6,975,267 B2 | 12/2005 | Stenger |
| 6,981,414 B2 | 1/2006 | Knowles |
| 7,005,750 B2 | 2/2006 | Liu |
| 7,012,489 B2 | 3/2006 | Sherrer |
| 7,030,712 B2 | 4/2006 | Brunette |
| 7,064,449 B2 | 6/2006 | Lin |
| 7,077,697 B2 | 7/2006 | Kooiman |
| 7,084,722 B2 | 8/2006 | Goyette |
| D530,674 S | 10/2006 | Ko |
| 7,116,190 B2 | 10/2006 | Brunker |
| 7,129,163 B2 | 10/2006 | Sherrer |

(56) References Cited

U.S. PATENT DOCUMENTS

| | | |
|---|---|---|
| 7,148,141 B2 | 12/2006 | Shim |
| 7,148,722 B1 | 12/2006 | Cliff |
| 7,148,772 B2 | 12/2006 | Sherrer |
| 7,165,974 B2 | 1/2007 | Kooiman |
| 7,217,156 B2 | 5/2007 | Wang |
| 7,222,420 B2 | 5/2007 | Moriizumi |
| 7,239,219 B2 | 7/2007 | Brown |
| 7,252,861 B2 | 8/2007 | Smalley |
| 7,259,640 B2 | 8/2007 | Brown |
| 7,383,632 B2 | 6/2008 | Dittmann |
| 7,388,388 B2 | 6/2008 | Dong |
| 7,400,222 B2 | 7/2008 | Kwon |
| 7,405,638 B2 | 7/2008 | Sherrer |
| 7,449,784 B2 | 11/2008 | Sherrer |
| 7,478,475 B2 | 1/2009 | Hall |
| 7,508,065 B2 | 3/2009 | Sherrer |
| 7,532,163 B2 | 5/2009 | Chang |
| 7,555,309 B2 | 6/2009 | Baldor |
| 7,575,474 B1 | 8/2009 | Dodson |
| 7,579,553 B2 | 8/2009 | Moriizumi |
| 7,602,059 B2 | 10/2009 | Nobutaka |
| 7,619,441 B1 | 11/2009 | Rahman |
| 7,628,617 B2 | 12/2009 | Brown |
| 7,645,147 B2 | 1/2010 | Dittmann |
| 7,645,940 B2 | 1/2010 | Shepherd |
| 7,649,432 B2 | 1/2010 | Sherrer |
| 7,656,256 B2 | 2/2010 | Houck |
| 7,658,831 B2 | 2/2010 | Mathieu |
| 7,683,842 B1 | 3/2010 | Engel |
| 7,705,456 B2 | 4/2010 | Hu |
| 7,741,853 B2* | 6/2010 | Blakely ................ G01R 15/202 324/500 |
| 7,755,174 B2 | 7/2010 | Rollin |
| 7,898,356 B2 | 3/2011 | Sherrer |
| 7,948,335 B2 | 5/2011 | Sherrer |
| 8,011,959 B1 | 9/2011 | Tsai |
| 8,031,037 B2 | 10/2011 | Sherrer |
| 8,188,932 B2 | 5/2012 | Worl |
| 8,264,297 B2 | 9/2012 | Thompson |
| 8,304,666 B2 | 11/2012 | Ko |
| 8,339,232 B2 | 12/2012 | Lotfi |
| 8,441,118 B2 | 5/2013 | Hua |
| 8,522,430 B2 | 9/2013 | Kacker |
| 8,542,079 B2 | 9/2013 | Sherrer |
| 8,641,428 B2 | 2/2014 | Light |
| 8,674,872 B2 | 3/2014 | Billaud |
| 8,742,874 B2 | 6/2014 | Sherrer |
| 8,814,601 B1 | 8/2014 | Sherrer |
| 8,888,504 B2 | 11/2014 | Pischler |
| 8,963,013 B2 | 2/2015 | Beroz |
| 9,000,863 B2 | 4/2015 | Sherrer |
| 9,306,254 B1* | 4/2016 | Hovey ................ H01P 3/06 |
| 9,325,044 B2 | 4/2016 | Reid |
| 9,536,843 B2 | 1/2017 | Takagi |
| 9,583,856 B2 | 2/2017 | Sherrer |
| 9,633,976 B1 | 4/2017 | Bernstein |
| 9,888,600 B2 | 2/2018 | Hovey |
| 2001/0040051 A1 | 11/2001 | Lipponen |
| 2001/0045361 A1 | 11/2001 | Boone |
| 2001/0054510 A1 | 12/2001 | Yoshida |
| 2002/0048973 A1 | 4/2002 | Zhou |
| 2002/0075104 A1 | 6/2002 | Kwon |
| 2002/0127768 A1 | 9/2002 | Badir |
| 2003/0029729 A1 | 2/2003 | Cheng |
| 2003/0052755 A1 | 3/2003 | Barnes |
| 2003/0117237 A1 | 6/2003 | Niu |
| 2003/0221968 A1 | 12/2003 | Cohen |
| 2003/0222738 A1 | 12/2003 | Brown |
| 2004/0000701 A1 | 1/2004 | White |
| 2004/0003524 A1 | 1/2004 | Ha |
| 2004/0004061 A1 | 1/2004 | Merdan |
| 2004/0007468 A1 | 1/2004 | Cohen |
| 2004/0007470 A1 | 1/2004 | Smalley |
| 2004/0038586 A1 | 2/2004 | Hall |
| 2004/0076806 A1 | 4/2004 | Miyanaga |
| 2004/0124961 A1 | 7/2004 | Aoyagi |
| 2004/0196112 A1 | 10/2004 | Welbon |
| 2004/0212381 A1 | 10/2004 | Yoshida |
| 2004/0263290 A1 | 12/2004 | Sherrer |
| 2005/0013977 A1 | 1/2005 | Wong |
| 2005/0030124 A1 | 2/2005 | Okamoto |
| 2005/0035775 A1 | 2/2005 | Zhou |
| 2005/0042932 A1* | 2/2005 | Mok ................ G01R 1/07371 439/700 |
| 2005/0045484 A1 | 3/2005 | Smalley |
| 2005/0156693 A1 | 7/2005 | Dove |
| 2005/0230145 A1 | 10/2005 | Ishii |
| 2005/0250253 A1 | 11/2005 | Cheung |
| 2007/0103178 A1 | 5/2007 | Kasukabe et al. |
| 2008/0191817 A1 | 8/2008 | Sherrer |
| 2008/0197946 A1 | 8/2008 | Houck |
| 2008/0199656 A1 | 8/2008 | Nichols |
| 2008/0240656 A1 | 10/2008 | Rollin |
| 2009/0004385 A1 | 1/2009 | Blackwell |
| 2009/0051476 A1 | 2/2009 | Tada |
| 2009/0154972 A1 | 6/2009 | Tanaka |
| 2010/0007016 A1 | 1/2010 | Oppermann |
| 2010/0015850 A1 | 1/2010 | Stein |
| 2010/0109819 A1 | 5/2010 | Houck |
| 2010/0225435 A1 | 9/2010 | Li |
| 2010/0296252 A1 | 11/2010 | Rollin |
| 2010/0323551 A1* | 12/2010 | Eldridge ............ G01R 1/06711 439/387 |
| 2011/0123783 A1 | 5/2011 | Sherrer |
| 2011/0123794 A1 | 5/2011 | Hiller |
| 2011/0181376 A1 | 7/2011 | Vanhille |
| 2011/0181377 A1 | 7/2011 | Vanhille |
| 2011/0210807 A1 | 9/2011 | Sherrer |
| 2011/0273241 A1 | 11/2011 | Sherrer |
| 2012/0182703 A1 | 7/2012 | Rendek, Jr. |
| 2012/0233849 A1 | 9/2012 | Smeys |
| 2013/0050055 A1 | 2/2013 | Paradiso |
| 2013/0127577 A1 | 5/2013 | Lotfi |
| 2016/0054385 A1 | 2/2016 | Suto |

FOREIGN PATENT DOCUMENTS

| | | |
|---|---|---|
| EP | 0398019 A1 | 11/1990 |
| EP | 0485831 A1 | 5/1992 |
| EP | 0845831 A2 | 6/1998 |
| EP | 0911903 A2 | 4/1999 |
| FR | 2086327 A1 | 12/1971 |
| GB | 2265754 | 10/1993 |
| JP | H027587 A | 1/1990 |
| JP | 3027587 | 2/1991 |
| JP | H041710 A | 1/1992 |
| JP | H0685510 A | 3/1994 |
| JP | H06302964 A | 10/1994 |
| JP | H07060844 | 3/1995 |
| JP | H07235803 | 9/1995 |
| JP | H10041710 | 2/1998 |
| JP | 1998163711 | 6/1998 |
| JP | 2001356136 | 12/2001 |
| JP | 2002533954 | 10/2002 |
| JP | 2003032007 | 1/2003 |
| JP | 2003249731 | 9/2003 |
| JP | 2004325306 | 11/2004 |
| JP | 200667621 | 3/2006 |
| JP | 2007253354 | 10/2007 |
| JP | 2008211159 | 9/2008 |
| JP | 2008306701 | 12/2008 |
| TW | I244799 | 12/2005 |
| WO | 0007218 A2 | 2/2000 |
| WO | 0039854 A1 | 7/2000 |
| WO | 0206152 A2 | 1/2002 |
| WO | 02080279 A1 | 10/2002 |
| WO | 2004000406 A1 | 12/2003 |
| WO | 2004004061 | 1/2004 |
| WO | 2005112105 | 11/2005 |
| WO | 2009013751 A2 | 1/2009 |

(56) References Cited

FOREIGN PATENT DOCUMENTS

| | | |
|---|---|---|
| WO | 2010111455 | 9/2010 |
| WO | 2015077009 | 5/2015 |

OTHER PUBLICATIONS

Brown et al., 'A Low-Loss Ka-Band Filter in Rectangular Coax Made by Electrochemical Fabrication', submitted to Microwave and Wireless Components Letters, date unknown {downloaded from www.memgen.com, 2004). NPL_1.
Chwomnawang et al., 'On-chip 3D Air Core Micro-Inductor for High-Frequency Applications Using Deformation of Sacrificial Polymer', Proc. SPIE, vol. 4334, pp. 54-62, Mar. 2001. NPL_2.
Elliott Brown/MEMGen Corporation, 'RF Applications of EFAB Technology', MTT-S IMS 2003, pp. 1-15. NPL_6.
Engelmann et al., 'Fabrication of High Depth-to-Width Aspect Ratio Microstructures', IEEE Micro Electro Mechanical Systems (Feb. 1992), pp. 93-98.
European Search Report of Corresponding European Application No. 07 15 0467 dated Apr. 28, 2008.
Frazier et al., 'M ET ALlic Microstructures Fabricated Using Photosensitive Polyimide Electroplating Molds', Journal of Microelectromechanical Systems, vol. 2, No. 2, Jun. 1993, pp. 87-94. NPL_8.
H. Guckel, 'High-Aspect-Ratio Micromachining Via Deep X-Ray Lithography', Proc. of IEEE, vol. 86, No. 8 (Aug. 1998), pp. 1586-1593. NPL_10.
Katehi et al., 'MEMS and Si Micromachined Circuits for High-Frequency Applications', IEEE Transactions on Microwave Theory and Techniques, vol. 50, No. 3, Mar. 2002, pp. 858-866. NPL_13.
Lee et al., 'Micromachining Applications of a High Resolution Ultrathick Photoresist', J. Vac. Sci. Technol. B 13 (6), Nov./Dec. 1995, pp. 3012-3016. NPL_15.
Loechel et al., 'Application of Ultraviolet Depth Lithography for Surface Micromachining', J. Vac. Sci. Technol. B 13 (6), Nov./Dec. 1995, pp. 2934-2939. NPL_16.
Park et al., 'Electroplated Micro-Inductors and Micro-Transformers for Wireless application', IMAPS 2002, Denver, CO, Sep. 2002. NPL_18.
Tummala et al.; 'Microelectronics Packaging Handbook'; Jan. 1, 1989; XP002477031; pp. 710-714. NPL_31.
Yoon et al., '3-D Lithography and M ET AL Surface Micromachining for RF and Microwave MEMs' IEEE MEMS 2002 Conference, Las Vegas, NV, Jan. 2002, pp. 673-676. NPL_21.
Yoon et al., 'CMOS-Compatible Surface Micromachined Suspended-Spiral Inductors for Multi-GHz Sillicon RF Ics', IEEE Electron Device Letters, vol. 23, No. 10, Oct. 2002, pp. 591-593. NPL_22.
Yoon et al., 'High-Performance Electroplated Solenoid-Type Integrated Inductor (SI2) for RF Applications Using Simple 3D Surface Micromachining Technology', Int'l Election Devices Meeting, 1998, San Francisco, CA, Dec. 6-9, 1998, pp. 544-547. NPL_23.
Yoon et al., 'High-Performance Three-Dimensional On-Chip Inductors Fabricated by Novel Micromachining Technology for RF MMIC', 1999 IEEE MTT-S Int'l Microwave Symposium Digest, vol. 4, Jun. 13-19, 1999, Anaheim, California, pp. 1523-1526. NPL_24.
Yoon et al., 'Monolithic High-Q Overhang Inductors Fabricated on Silicon and Glass Substrates', International Electron Devices Meeting, Washington D.C. (Dec. 1999), pp. 753-756. NPL_25.
Yoon et al., 'Monolithic Integration of 3-D Electroplated Microstructures with Unlimited Number of Levels Using Planarization with a Sacrificial M ET ALlic Mole (PSMm)', Twelfth IEEE Int'l Conf. on Micro Electro mechanical systems, Orlando Florida, Jan. 1999, pp. 624-629. NPL_26.
Yoon et al., 'Multilevel Microstructure Fabrication Using Single-Step 3D Photolithography and Single-Step Electroplating', Proc. of SPIE, vol. 3512, (Sep. 1998), pp. 358-366. NPL_27.

Filipovic et al.; 'Modeling, Design, Fabrication, and Performance of Rectangular .mu.—Coaxial Lines and Components'; Microwave Symposium Digest, 2006, IEEE; Jun. 1, 2006; pp. 1393-1396.
European Search Report of corresponding European Application No. 08 15 3138 dated Jul. 15, 2008.
Ali Darwish et al.; Vertical Balun and Wilkinson Divider; 2002 IEEE MTT-S Digest; pp. 109-112. NPL_30.
Cole, B.E., et al., Micromachined Pixel Arrays Integrated with CMOS for Infrared Applications, pp. 64-64 (2000). NPL_3.
De Los Santos, H.J., Introduction to Microelectromechanical (MEM) Microwave Systems {pp. 4, 7-8, 13) (1999). NPL_4.
Deyong, C, et al., A Microstructure Semiconductor Thermocouple for Microwave Power Sensors, 1997 Asia Pacific Microwave Conference, pp. 917-919. NPL_5.
Franssila, S., Introduction to Microfabrication, (pp. 8) (2004). NPL_7.
Ghodisian, B., et al., Fabrication of Affordable M ET ALlic Microstructures by Electroplating and Photoresist Molds, 1996, pp. 68-71. NPL_9.
Hawkins, C.F., The Microelectronics Failure Analysis, Desk Reference Edition (2004). NPL_11.
Jeong, Inho et al., 'High-Performance Air-Gap Transmission Lines and Inductors for Millimeter-Wave Applications', IEEE Transactions on Microwave Theory and Techniques, Dec. 2002, pp. 2850-2855, vol. 50, No. 12. NPL_12.
Kenneth J. Vanhille et al.; Micro-Coaxial Imedance Transformers; Journal of Latex Class Files; vol. 6; No. 1; Jan. 2007. NPL_29.
Kwok, P.Y., et al., Fluid Effects in Vibrating Micromachined Structures, Journal of Microelectromechanical Systems, vol. 14, No. 4, Aug. 2005, pp. 770-781. NPL_14.
Madou, M.J., Fundamentals of Microfabrication: The Science of Miniaturization, 2d Ed., 2002 (Roadmap; pp. 615-668). NPL_17.
Sedky, S., Post-Processing Techniques for Integrated MEMS (pp. 9, 11, 164) (2006). NPL_19.
Yeh, J.L., et al., Copper-Encapsulated Silicon Micromachined Structures, Journal of Microelectromechanical Systems, vol. 9, No. 3, Sep. 2000, pp. 281-287. NPL_20.
Yoon et al., "High-Performance Electroplated Solenoid-Type Integrated Inductor (S12) for RF Applications Using Simple 3D Surface Micromachining Technology", Int'l Election Devices Meeting, 1998, San Francisco, CA, Dec. 6-9, 1998, pp. 544-547.
Chance, G.I. et al., "A suspended-membrane balanced frequency doubler at 200GHz," 29th International Conference on Infrared and Millimeter Waves and Terahertz Electronics, pp. 321-322, Karlsrube, 2004.
Colantonio, P., et al., "High Efficiency RF and Microwave Solid State Power Amplifiers," pp. 380-395, 2009.
Ehsan, N., "Broadband Microwave Litographic 3D Components," Dissertation 2009.
Ehsan, N. et al., "Microcoaxial lines for active hybrid-monolithic circuits," 2009 IEEE MTT-S Int. Microwave.Symp. Boston, MA, Jun. 2009.
European Examination Report dated Mar. 21, 2013 for EP Application No. 07150463.3.
European Examination Report of corresponding European Patent Application No. 08 15 3144 dated Apr. 6, 2010.
European Examination Report of corresponding European Patent Application No. 08 15 3144 dated Feb. 22, 2012.
European Examination Report of corresponding European Patent Application No. 08 15 3144 dated Nov. 10, 2008.
European Search Report for corresponding EP Application No. 07150463.3 dated Apr. 23, 2012.
European Search Report of corresponding European Patent Application No. 08 15 3144 dated Jul. 2, 2008.
Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.
Filipovic, D.S., "Design of microfabricated rectangular coaxial lines and components for mm-wave applications," Microwave Review, vol. 12, No. 2, Nov. 2006, pp. 11-16.
Immorlica, Jr., T. et al., "Miniature 3D micro-machined solid state power amplifiers," COMCAS 2008.

(56) References Cited

OTHER PUBLICATIONS

Ingram, D.L. et al., "A 427 mW 20% compact W-band InP HEMT MMIC power amplifier," IEEE RFIC Symp. Digest 1999, pp. 95-98.

International Preliminary Report on Patentability dated Jul. 24, 2012 for corresponding PCT/US2011/022173.

International Preliminary Report on Patentability dated May 19, 2006 on corresponding PCT/US04/06665.

International Search Report dated Aug. 29, 2005 on corresponding PCT/US04/06665.

Jeong, I., et al., "High Performance Air-Gap Transmission Lines and Inductors for Milimeter-Wave Applications", Transactions on Microwave Theory and Techniques, vol. 50, No. 12, Dec. 2002.

Lukic, M. et al., "Surface-micromachined dual Ka-band cavity backed patch antennas," IEEE Trans. AtennasPropag., vol. 55, pp. 2107-2110, Jul. 2007.

Oliver, J.M. et al., "A 3-D micromachined W-band cavity backed patch antenna array with integrated rectacoax transition to waveguide," 2009 Proc. IEEE International Microwave Symposium, Boston, MA 2009.

PwrSoC Update 2012: Technology, Challenges, and Opportunities for Power Supply on Chip, Presentation (Mar. 18, 2013).

Rollin, J.M. et al., "A membrane planar diode for 200GHz mixing applications," 29th International Conference on Infrared and Millimeter Waves and Terahertz Electronics, pp. 205-206, Karlsrube, 2004.

Rollin, J.M. et al., "Integrated Schottky diode for a sub-harmonic mixer at millimetre wavelengths," 31st International Conference on Infrared and Millimeter Waves and Terahertz Electronics, Paris, 2006.

Saito, Y., Fontaine, D., Rollin, J-M., Filipovic, D., 'Micro-Coaxial Ka-Band Gysel Power Dividers,' Microwave Opt Technol Lett 52: 474-478, 2010, Feb. 2010.

Saito et al., "Analysis and design of monolithic rectangular coaxial lines for minimum coupling," IEEE Trans. Microwave Theory Tech., vol. 55, pp. 2521-2530, Dec. 2007.

Sherrer, D, Vanhille, K, Rollin, J.M., 'PolyStrata Technology: A Disruptive Approach for 3D Microwave Components and Modules,' Presentation (Apr. 23, 2019).

Vanhille, K., 'Design and Characterization of Microfabricated Three-Dimensional Millimeter-Wave Components,' Dissertation, 2007.

Vanhille, K. et al., 'Balanced low-loss Ka-band—coaxial hybrids,' IEEE MTT-S Dig., Honolulu, Hawaii, Jun. 2007.

Vanhille, K. et al., "Ka-Band surface mount directional coupler fabricated using micro-rectangular coaxial transmission lines," 2008 Proc. IEEE International Microwave Symposium, 2008.

Vanhille, K.J. et al., "Ka-band miniaturized quasi-planar high-Q resonators," IEEE Trans. Microwave Theory Tech., vol. 55, No. 6, pp. 1272-1279, Jun. 2007.

Vyas R. et al., "Liquid Crystal Polymer (LCP): The ultimate solution for low-cost RF flexible electronics and antennas," Antennas and Propagation Society, International Symposium, p. 1729-1732 (2007).

Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.

Wang, H. et al., "Power-amplifier modules covering 70-113 GHz using MMICs," IEEE Trans Microwave Theory and Tech., vol. 39, pp. 9-16, Jan. 2001.

Written Opinion of the International Searching Authority dated Aug. 29, 2005 on corresponding PCT/US04/06665.

"Multiplexer/LNA Module using PolyStrata®," GOMACTech-15, Mar. 26, 2015.

A. Boryssenko, J. Arroyo, R. Reid, M.S. Heimbeck, "Substrate free G-band Vivaldi antenna array design, fabrication and testing" 2014 IEEE International Conference on Infrared, Millimeter, and Terahertz Waves, Tucson, Sep. 2014.

A. Boryssenko, K. Vanhille, "300-GHz microfabricated waveguide slotted arrays" 2014 IEEE International Conference on Infrared, Millimeter, and Terahertz Waves, Tucson, Sep. 2014.

A.A. Immorlica Jr., R. Actis, D. Nair, K. Vanhille, C. Nichols, J.-M. Rollin, D. Fleming, R. Varghese, D. Sherrer, D. Filipovic, E. Cullens, N. Ehsan, and Z. Popovic, "Miniature 3D micromachined solid state amplifiers," in 2008 IEEE International Conference on Microwaves, Communications, Antennas, and Electronic Systems, Tel-Aviv, Israel, May 2008, pp. 1-7.

B. Cannon, K. Vanhille, "Microfabricated Dual-Polarized, W-band Antenna Architecture for Scalable Line Array Feed," 2015 IEEE Antenna and Propagation Symposium, Vancouver, Canada, Jul. 2015.

D. Filipovic, G. Potvin, D. Fontaine, C. Nichols, Z. Popovic, S. Rondineau, M. Lukic, K. Vanhille, Y. Saito, D. Sherrer, W. Wilkins, E. Daniels, E. Adler, and J. Evans, "Integrated micro-coaxial Ka-band antenna and array," GomacTech 2007 Conference, Mar. 2007.

D. Filipovic, G. Potvin, D. Fontaine, Y. Saito, J.-M. Rollin, Z. Popovic, M. Lukic, K. Vanhille, C. Nichols, "μ-coaxial phased arrays for Ka-Band Communications," Antenna Applications Symposium, Monticello, IL, Sep. 2008, pp. 104-115.

D. Filipovic, Z. Popovic, K. Vanhille, M. Lukic, S. Rondineau, M. Buck, G. Potvin, D. Fontaine, C. Nichols, D. Sherrer, S. Zhou, W. Houck, D. Fleming, E. Daniel, W. Wilkins, V. Sokolov, E. Adler, and J. Evans, "Quasi-planar rectangular ¼-coaxial structures for mm-wave applications," Proc. GomacTech., pp. 28-31, San Diego, Mar. 2006.

D. Sherrer, "Improving electronics\ functional density," MICROmanufacturing, May/Jun. 2015, pp. 16-18.

D.S. Filipovic, M. Lukic, Y. Lee and D. Fontaine, "Monolithic rectangular coaxial lines and resonators with embedded dielectric support," IEEE Microwave and Wireless Components Letters, vol. 18, No. 11, pp. 740-742, 2008.

E. Cullens, "Microfabricated Broadband Components for Microwave Front Ends," Thesis, 2011.

E. Cullens, K. Vanhille, Z. Popovic, "Miniature bias-tee networks integrated in microcoaxial lines," in Proc. 40th European Microwave Conf., Paris, France, Sep. 2010, pp. 413-416.

E. Cullens, L. Ranzani, E. Grossman, Z. Popovic, "G-Band Frequency Steering Antenna Array Design and Measurements," Proceedings of the XXXth URSI General Assembly, Istanbul, Turkey, Aug. 2011.

E. Cullens, L. Ranzani, K. Vanhille, E. Grossman, N. Ehsan, Z. Popovic, "Micro-Fabricated 130-180 GHz frequency scanning waveguide arrays," IEEE Trans. Antennas Propag., Aug. 2012, vol. 60, No. 8, pp. 3647-3653.

European Examination Report of EP App. No. 07150463.3 dated Feb. 16, 2015.

H. Kazemi, "350mW G-band Medium Power Amplifier Fabricated Through a New Method of 3D-Copper Additive Manufacturing," IEEE 2015.

H. Kazemi, "Ultra-compact G-band 16way Power Splitter/Combiner Module Fabricated Through a New Method of 3D-Copper Additive Manufacturing," IEEE 2015.

H. Zhou, N. A. Sutton, D. S. Filipovic, "Surface micromachined millimeter-wave log-periodic dipole array antennas," IEEE Trans. Antennas Propag., Oct. 2012, vol. 60, No. 10, pp. 4573-4581.

H. Zhou, N. A. Sutton, D. S. Filipovic, "Wideband W-band patch antenna," 5th European Conference on Antennas and Propagation, Rome, Italy, Apr. 2011, pp. 1518-1521.

H. Zhou, N.A. Sutton, D. S. Filipovic, "W-band endfire log periodic dipole array," Proc. IEEE-APS/URSI Symposium, Spokane, WA, Jul. 2011, pp. 1233-1236.

Horton, M.C., et al., "The Digital Elliptic Filter—Compact Sharp-Cutoff Design for Wide Bandstop or Bandpass Requirements," IEEE Transactions on Microwave Theory and Techniques, (1967) MTT-15:307-314.

International Search Report corresponding to PCT/US12/46734 dated Nov. 20, 2012.

J. M. Oliver, J.-M. Rollin, K. Vanhille, S. Raman, "A W-band micromachined 3-D cavity-backed patch antenna array with inte-

(56) References Cited

OTHER PUBLICATIONS grated diode detector," IEEE Trans. Microwave Theory Tech., Feb. 2012, vol. 60, No. 2, pp. 284-292.

J. M. Oliver, P. E. Ralston, E. Cullens, L. M. Ranzani, S. Raman, K. Vanhille, "A W-band Micro-coaxial Passive Monopulse Comparator Network with Integrated Cavity-Backed Patch Antenna Array," 2011 IEEE MTT-S Int. Microwave, Symp., Baltimore, MD, Jun. 2011.

J. Mruk, "Wideband Monolithically Integrated Front-End Subsystems and Components," Thesis, 2011.

J. Mruk, Z. Hongyu, M. Uhm, Y. Saito, D. Filipovic, "Wideband mm-Wave Log-Periodic Antennas," 3rd European Conference on Antennas and Propagation, pp. 2284-2287, Mar. 2009.

J. Oliver, "3D Micromachined Passive Components and Active Circuit Integration for Millimeter-Wave Radar Applications," Thesis, Feb. 10, 2011.

J. R. Mruk, H. Zhou, H. Levitt, D. Filipovic, "Dual wideband monolithically integrated millimeter-wave passive front-end subsystems," in 2010 Int. Conf. on Infrared, Millimeter and Terahertz Waves , Sep. 2010, pp. 1-2.

J. R. Mruk, N. Sutton, D. S. Filipovic, "Micro-coaxial fed 18 to 110 GHz planar log-periodic antennas with RF transitions," IEEE Trans. Antennas Propag., vol. 62, No. 2, Feb. 2014, pp. 968-972.

J. Reid, "PolyStrata Millimeter-wave Tunable Filters," GOMACTech-12, Mar. 22, 2012.

J.M. Oliver, H. Kazemi, J.-M. Rollin, D. Sherrer, S. Huettner, S. Raman, "Compact, low-loss, micromachined rectangular coaxial millimeter-wave power combining networks," 2013 IEEE MTT-S Int. Microwave, Symp., Seattle, WA, Jun. 2013.

J.R. Mruk, Y. Saito, K. Kim, M. Radway, D. Filipovic, "A directly fed Ku- to W-band 2-arm Archimedean spiral antenna," Proc. 41st European Microwave Conf., Oct. 2011, pp. 539-542.

J.R. Reid, D. Hanna, R.T. Webster, "A 40/50 GHz diplexer realized with three dimensional copper micromachining," in 2008 IEEE MTT-S Int. Microwave Symp., Atlanta, GA, Jun. 2008, pp. 1271-1274.

J.R. Reid, J.M. Oliver, K. Vanhille, D. Sherrer, "Three dimensional metal micromachining: A disruptive technology for millimeter-wave filters," 2012 IEEE Topical Meeting on Silicon Monolithic Integrated Circuits in RF Systems, Jan. 2012.

K. J. Vanhille, D. L. Fontaine, C. Nichols, D. S. Filipovic, and Z. Popovic, "Quasi-planar high-Q millimeter-wave resonators," IEEE Trans. Microwave Theory Tech., vol. 54, No. 6, pp. 2439-2446, Jun. 2006.

K. M. Lambert, F. A. Miranda, R. R. Romanofsky, T. E. Durham, K. J. Vanhille, "Antenna characterization for the Wideband Instrument for Snow Measurements (WISM)," 2015 IEEE Antenna and Propagation Symposium, Vancouver, Canada, Jul. 2015.

K. Vanhille, "Design and Characterization of Microfabricated Three-Dimensional Millimeter-Wave Components," Thesis, 2007.

K. Vanhille, M. Buck, Z. Popovic, and D.S. Filipovic, "Miniature Ka-band recta-coax components: analysis and design," presented at 2005 AP-S/URSI Symposium, Washington, DC, Jul. 2005.

K. Vanhille, M. Lukic, S. Rondineau, D. Filipovic, and Z. Popovic, "Integrated micro-coaxial passive components for millimeter-wave antenna front ends," 2007 Antennas, Radar, and Wave Propagation Conference, May 2007.

K. Vanhille, T. Durham, W. Stacy, D. Karasiewicz, A. Caba, C. Trent, K. Lambert, F. Miranda, "A microfabricated 8-40 GHz dual-polarized reflector feed," 2014 Antenna Applications Symposium, Monticello, IL, Sep. 2014. pp. 241-257.

L. Ranzani, D. Kuester, K. J. Vanhille, A Boryssenko, E. Grossman, Z. Popovic, "G-Band micro-fabricated frequency-steered arrays with 2° C./GHz beam steering," IEEE Trans. on Terahertz Science and Technology, vol. 3, No. 5, Sep. 2013.

L. Ranzani, E. D. Cullens, D. Kuester, K. J. Vanhille, E. Grossman, Z. Popovic, "W-band micro-fabricated coaxially-fed frequency scanned slot arrays," IEEE Trans. Antennas Propag., vol. 61, No. 4, Apr. 2013.

L. Ranzani, I. Ramos, Z. Popovic, D. Maksimovic, "Microfabricated transmission-line transformers with DC isolation," URSI National Radio Science Meeting, Boulder, CO, Jan. 2014.

L. Ranzani, N. Ehsan, Z. Popovi‡, "G-band frequency-scanned antenna arrays," 2010 IEEE APS-URSI International Symposium, Toronto, Canada, Jul. 2010.

M. Lukic, D. Filipovic, "Modeling of surface roughness effects on the performance of rectangular μ-coaxial lines," Proc. 22nd Ann. Rev. Prog. Applied Comp. Electromag. (ACES), pp. 620-625, Miami, Mar. 2006.

M. Lukic, D. Fontaine, C. Nichols, D. Filipovic, "Surface micromachined Ka-band phased array antenna," Presented at Antenna Applic. Symposium, Monticello, IL, Sep. 2006.

M. Lukic, K. Kim, Y. Lee, Y. Saito, and D. S. Filipovic, "Multi-physics design and performance of a surface micromachined Ka-band cavity backed patch antenna," 2007 SBMO/IEEE Int. Microwave and Optoelectronics Conf., Oct. 2007, pp. 321-324.

M. Lukic, S. Rondineau, Z. Popovic, D. Filipovic, "Modeling of realistic rectangular μ-coaxial lines," IEEE Trans. Microwave Theory Tech., vol. 54, No. 5, pp. 2068-2076, May 2006.

M. V. Lukic, and D. S. Filipovic, "Integrated cavity-backed ka-band phased array antenna," Proc. IEEE-APS/URSI Symposium, Jun. 2007, pp. 133-135.

M. V. Lukic, and D. S. Filipovic, "Modeling of 3-D Surface Roughness Effects With Application to μ-Coaxial Lines," IEEE Trans. Microwave Theory Tech., Mar. 2007, pp. 518-525.

M. V. Lukic, and D. S. Filipovic, "Surface-micromachined dual Ka-and cavity backed patch antenna," IEEE Trans. Antennas Propag., vol. 55, No. 7, pp. 2107-2110, Jul. 2007.

Mruk, J.R., Filipovic, D.S, "Micro-coaxial V-/W-band filters and contiguous diplexers," Microwaves, Antennas & Propagation, IET, Jul. 17, 2012, vol. 6, issue 10, pp. 1142-1148.

Mruk, J.R., Saito, Y., Kim, K., Radway, M., Filipovic, D.S., "Directly fed millimetre-wave two-arm spiral antenna," Electronics Letters, Nov. 25, 2010, vol. 46 , issue 24, pp. 1585-1587.

N. Chamberlain, M. Sanchez Barbetty, G. Sadowy, E. Long, K. Vanhille, "A dual-polarized metal patch antenna element for phased array applications," 2014 IEEE Antenna and Propagation Symposium, Memphis, Jul. 2014. pp. 1640-1641.

N. Ehsan, "Broadband Microwave Lithographic 3D Components," Thesis, 2009.

N. Ehsan, K. Vanhille, S. Rondineau, E. Cullens, Z. Popovic, "Broadband Wilkinson Dividers," IEEE Trans. Microwave Theory Tech., Nov. 2009, pp. 2783-2789.

N. Ehsan, K.J. Vanhille, S. Rondineau, Z. Popovic, "Micro-coaxial impedance transformers," IEEE Trans. Microwave Theory Tech., Nov. 2010, pp. 2908-2914.

N. Jastram, "Design of a Wideband Millimeter Wave Micromachined Rotman Lens," IEEE Transactions on Antennas and Propagation, vol. 63, No. 6, Jun. 2015.

N. Jastram, "Wideband Millimeter-Wave Surface Micromachined Tapered Slot Antenna," IEEE Antennas and Wireless Propagation Letters, vol. 13, 2014.

N. Jastram, "Wideband Multibeam Millimeter Wave Arrays," IEEE 2014.

N. Jastram, D. Filipovic, "Monolithically integrated K/Ka array-based direction finding subsystem," Proc. IEEE-APS/URSI Symposium, Chicago, IL, Jul. 2012, pp. 1-2.

N. Jastram, D. S. Filipovic, "Parameter study and design of W-band micromachined tapered slot antenna," Proc. IEEE-APS/URSI Symposium, Orlando, FL, Jul. 2013, pp. 434-435.

N. Jastram, D. S. Filipovic, "PCB-based prototyping of 3-D micromachined RF subsystems," IEEE Trans. Antennas Propag., vol. 62, No. 1, Jan. 2014. pp. 420-429.

N. Sutton, D.S. Filipovic, "Design of a K- thru Ka-band modified Butler matrix feed for a 4-arm spiral antenna," 2010 Loughborough Antennas and Propagation Conference, Loughborough, UK, Nov. 2010, pp. 521-524.

N.A. Sutton, D. S. Filipovic, "V-band monolithically integrated four-arm spiral antenna and beamforming network," Proc. IEEE-APS/URSI Symposium, Chicago, IL, Jul. 2012, pp. 1-2.

N.A. Sutton, J. M. Oliver, D. S. Filipovic, "Wideband 15-50 GHz symmetric multi-section coupled line quadrature hybrid based on

(56) References Cited

OTHER PUBLICATIONS surface micromachining technology," 2012 IEEE MTT-S Int. Microwave, Symp., Montreal, Canada, Jun. 2012.
N.A. Sutton, J.M. Oliver, D.S. Filipovic, "Wideband 18-40 GHz surface micromachined branchline quadrature hybrid," IEEE Microwave and Wireless Components Letters, Sep. 2012, vol. 22, No. 9, pp. 462-464.
P. Ralston, K. Vanhille, A. Caba, M. Oliver, S. Raman, "Test and verification of micro coaxial line power performance," 2012 IEEE MTT-S Int. Microwave, Symp., Montreal, Canada, Jun. 2012.
P. Ralston, M. Oliver, K. Vummidi, S. Raman, "Liquid-metal vertical interconnects for flip chip assembly of GaAs C-band power amplifiers onto micro-rectangular coaxial transmission lines," IEEE Compound Semiconductor Integrated Circuit Symposium, Oct. 2011.
P. Ralston, M. Oliver, K. Vummidi, S. Raman, "Liquid-metal vertical interconnects for flip chip assembly of GaAs C-band power amplifiers onto micro-rectangular coaxial transmission lines," IEEE Journal of Solid-State Circuits, Oct. 2012, vol. 47, No. 10, pp. 2327-2334.
S. Huettner, "High Performance 3D Micro-Coax Technology," Microwave Journal, Nov. 2013. [online: http://www.microwavejournal.com/articles/21004-high-performance-3d-micro-coax-technology].
S. Huettner, "Transmission lines withstand vibration," Microwaves and RF, Mar. 2011. [online: http://mwrf.com/passive-components/transmission-lines-withstand-vibration].
S. Scholl, C. Gorle, F. Houshmand, T. Liu, H. Lee, Y. Won, H. Kazemi, M. Asheghi, K. Goodson, "Numerical Simulation of Advanced Monolithic Microcooler Designs for High Heat Flux Microelectronics," InterPACK, San Francisco, CA, Jul. 2015.
S. Scholl, C. Gorle, F. Houshmand, T. Verstraete, M. Asheghi, K. Goodson, "Optimization of a microchannel geometry for cooling high heat flux microelectronics using numerical methods," InterPACK, San Francisco, CA, Jul. 2015.
T. Durham, H.P. Marshall, L. Tsang, P. Racette, Q. Bonds, F. Miranda, K. Vanhille, "Wideband sensor technologies for measuring surface snow," Earthzine, Dec. 2013, [online: http://www.earthzine.org/2013/12/02/wideband-sensor-technologies-for-measuring-surface-snow/].
T. E. Durham, C. Trent, K. Vanhille, K. M. Lambert, F. A. Miranda, "Design of an 8-40 GHz Antenna for the Wideband Instrument for Snow Measurements (WISM)," 2015 IEEE Antenna and Propagation Symposium, Vancouver, Canada, Jul. 2015.
T. Liu, F. Houshmand, C. Gorle, S. Scholl, H. Lee, Y. Won, H. Kazemi, K. Vanhille, M. Asheghi, K. Goodson, "Full-Scale Simulation of an Integrated Monolithic Heat Sink for Thermal Management of a High Power Density GaN—SiC Chip," InterPACK/ICNMM, San Francisco, CA, Jul. 2015.
T.E. Durham, "An 8-40GHz Wideband Instrument for Snow Measurements," Earth Science Technology Forum, Pasadena, CA, Jun. 2011.
Written Opinion corresponding to PCT/US12/46734 dated Nov. 20, 2012.
Y. Saito, D. Fontaine, J.-M. Rollin, D.S. Filipovic, "Monolithic micro-coaxial power dividers," Electronic Letts., Apr. 2009, pp. 469-470.
Y. Saito, J.R. Mruk, J.-M. Rollin, D.S. Filipovic, "X- through Q-band log-periodic antenna with monolithically integrated u-coaxial impedance transformer/feeder," Electronic Letts. Jul. 2009, pp. 775-776.
Y. Saito, M.V. Lukic, D. Fontaine, J.-M. Rollin, D.S. Filipovic, "Monolithically Integrated Corporate-Fed Cavity-Backed Antennas," IEEE Trans. Antennas Propag., vol. 57, No. 9, Sep. 2009, pp. 2583-2590.
Z. Popovic, K. Vanhille, N. Ehsan, E. Cullens, Y. Saito, J.-M. Rollin, C. Nichols, D. Sherrer, D. Fontaine, D. Filipovic, "Micro-fabricated micro-coaxial millimeter-wave components," in 2008 Int. Conf. on Infrared, Millimeter and Terahertz Waves, Pasadena, CA, Sep. 2008, pp. 1-3.
Z. Popovic, S. Rondineau, D. Filipovic, D. Sherrer, C. Nichols, J.-M. Rollin, and K. Vanhille, "An enabling new 3D architecture for microwave components and systems," Microwave Journal, Feb. 2008, pp. 66-86.
Z. Popovic, "Micro-coaxial micro-fabricated feeds for phased array antennas," in IEEE Int. Symp. on Phased Array Systems and Technology, Waltham, MA, Oct. 2010, pp. 1-10. (Invited).
"Shiffman phase shifters designed to work over a 15-45GHz range," phys.org, Mar. 2014. [online: http://phys.org/wire-news/156496085/schiffman-phase-shifters-designed-to-work-over-a-15-45ghz-range.html].
Extended EP Search Report for EP Application No. 12811132.5 dated Feb. 5, 2016.
International Search Report and Written Opinion for PCT/US2015/063192 dated May 20, 2016.
Derwent Abstract Translation of WO-2010-011911 A2 (published 2010).
Tian, et al.; Fabrication of multilayered SU8 structure for terahertz waveguide with ultralow transmission loss; Aug. 18, 2013; Dec. 10, 2013; pp. 13002-1 to 13002-6.

\* cited by examiner

WAFER SCALE TEST INTERFACE UNIT AND CONTACTORS

RELATED APPLICATIONS

This application is a 371 application of International Application No. PCT/US2015/011789 filed Jan. 16, 2015, which claims the benefit of priority of U.S. Provisional Application No. 61/928,767 filed on Jan. 17, 2014, the entire contents of which application(s) are incorporated herein by reference.

FIELD OF THE INVENTION

The present invention relates generally to mixed signal RF, high speed digital interconnects, shielded DC lines, and more particularity, but not exclusively, to their implementation for multilayer packages, antenna array feeds, test interface units, connectors, contactors, and large format substrates, including methods for their fabrication.

BACKGROUND OF THE INVENTION

Printed Circuit Boards (PCB) are the current mainstay for virtually all integrated circuit assembly and packaging today for computers, laptops, cell phones, cameras, TVs, appliances, avionics, etc. However new high speed and high density circuit technologies are emerging which will severely impact PCB performance. As Moore's Law for integrated circuits continues to scale toward smaller transistor sizes, the results are higher clock rate frequencies and increased functionality as more transistors are packed into ever smaller areas. Consequently, new integrated circuit inputs and outputs (I/O) are physically smaller, are much closer together in spacing (called pitch), can be either RF, DC, analog or digital, and operate at much higher data rates and higher frequencies.

Current PCB materials and construction methods are not scalable for the smaller geometries and higher densities of the new integrated circuits and are inadequate as the clock rates approach 100 Gigabits per second (Gb/s). Presently, PCB high speed digital and RF interconnects are implemented as transmission lines; either microstrip or stripline to control the impedance (usually 50 ohms) These lines are manufactured using metal foil bonded to organic substrate or dielectric material using: (i) glass-reinforced epoxy laminate sheets (called FR-4); or (ii) polytetrafluoroethylene (trade name is called Teflon); or (iii) a flexible material such as polyimide; or (iv) a combination of thereof. Patterns are etched into the foil to form interconnects and vias are drilled and plated. To make multilayer PCB, subsequent sheets are processed similarly and finally all the respective layers are bonded together using heat and pressure to form a signal multilayer PCB. The final step in the process is to plate the top and bottom surfaces with a material suitable for assembly (gold or solder) and then coated with a material to seal the inner layers and provide a solder stop or resist.

As a function of Moore's Law, integrated circuits continue grow in the number of transistors per chip and proportionately need more I/O for a given chip. The effect of more I/O in a given area causes the pitch of the contacts of the I/O to be smaller. The construction methods of PCB by etching foil bonded to organic materials is limited in how small the interconnects can be patterned. Another limitation is the via size needed to route a signal from one layer of the PCB to another layer. In addition to the size of the via, minimum spacing rules between the vias and the conductive 'capture pads' around the vias increases the trace-to-trace pitch achievable with PCB technologies. Also, multiple rows of vias are necessary for optimal trace-to-trace isolation. Multiple layers are needed for all the I/O to "escape" the small area of the chip and be routed to other destinations on the PCB. The more signal interconnects needed result in more layers and a thicker PCB. The thicker a PCB is, the bigger the via is, since a bigger drill bit is needed to drill through thicker PCB materials. The bigger vias cause congestion in the interconnects around the chip I/O escape area which also degrades performance.

Due to these construction methods, PCB signal interconnects are in direct contact with the dielectric material and thus a major source of signal loss, especially at higher data rates and RF frequencies (called dielectric loss). Another source of higher frequency loss is due to the skin effects of the metal foil interconnects; the surface roughness of the interconnect causes signal loss to electromagnetic wave propagation (called skin effect loss). Moreover, the skin effects are most severe at the bottom of the metal interconnect trace as the copper foil must have a certain amount of surface roughness to ensure adequate bonding strength to the PCB substrate material. Bigger vias (as described above) are another source of loss in the signal (called a discontinuity).

Another major problem with PCB materials and construction techniques is the isolation or crosstalk between two adjacent digital signal interconnects. Crosstalk is when the energy content of one signal (sometimes referred to as the "offender" line) is transferred onto a different signal (called the "victim") and causing signal degradation or a bit error of the victim. As the data rates increase to 100 Gb/s the frequency content of the signal also increases which makes it easier for the offender data lines to contaminate the victim digital data lines. The crosstalk problem becomes quite acute as the pitch of signal interconnects becomes closer together.

PCB interfaces are connections and contactors that serve to make or break between: (i) two different PCBs; (ii) a PCB and a cable; (iii) a PCB and a test interface unit; and (iv) test interface unit to a device under test (DUT). A DUT may typically be one or more semiconductor die on a wafer or removed from a wafer. For each of these interfaces, the contactors must take different form factors to serve the application. For example, PCB-to-PCB interface might require just a few mating cycles for a given mean time between failure (MTBF). A PCB-to-cable will require a higher number of mating cycles between failure. And finally a test interface unit will have a specified number of make-break cycles of the contactors. All of the contactors interfaces are inadequate for 100 Gb/s (loss and crosstalk performance) or are limited in very high signal density as a function of very small pitches demanded by new semiconductors.

Thus, it would be an advancement to the art to provide a high density interconnect that can scale to the small geometries of the integrated circuit and provide a low loss medium and provide very high isolation as the speed of the semiconductor approach 100 Gb/s as well as providing methods of their manufacture.

SUMMARY OF THE INVENTION

In one of its aspects the present invention relates to a 3D coaxial distribution network structure or mostly air-filled dielectric coaxial structure that is photolithographically defined with very tight tolerances. Such a construction is the optimal structure to provide high speed digital, shielded DC, and RF interconnects and routing. This is particularly the case when a 2D planar grid of electrical contact points on a small pitch must be interfaced with complex electronics that require pitch that necessitates a much larger 2D planar grid. For example in EHF phased arrays, antennas must be on a small spacing dictated by the wavelength or frequency of operation, however the support electronics needed for each antenna may need a much larger spacing in order to fit. Thus a 3D redistribution network must route from the pitch of the electronics down to the pitch of the smaller antennas.

A somewhat similar problem occurs in testing integrated circuit devices where the test electronics and the pitch of the bond pads or solder bumps on the chip or multi-chip module (MCM) are quite small, the test equipment is large, and particularly at frequencies and data rates increasing, for example approaching 10's or 100 Gb/s. In wafer die testing, as the communications chips on wafers require increasing frequency RF testing, and complex circuit testing, to determine pass/fail criteria before being sold, the industry faces a challenge to route input and output RF test signals as well as DC feed lines on 2D pitches where pads may be spaced on 0.5 mm spacing, but continue to trend to smaller pitches which are ultimately limited by the ability to test pads or solder bumps on the desired spacing. At these increasing frequencies, the ability to maintain both high isolation between DC and RF test and power lines as well as substantially low insertion loss in the interconnection between test equipment and the contacts into the chip are both desirable features. Thus a shielded 3D transmission line structure is an ideal approach to solve the problem. The 3D coax structure may be composed almost entirely of metal and air, with no confining substrate.

In a preferred configuration, the 3D coax structure may be implemented with a copper center conductor suspended in an air dielectric (using small dielectric support structures) and surrounded by copper ground shielding. At microwave frequencies, air is the lowest loss practical medium possible. Moreover, using a precision layer by layer manufacturing process leveraging lithography and photomolds achieves great precision and smooth surfaces thus minimizing skin effect losses and discontinuity losses. One such process is the PolyStrata® technology offered by Nuvotronics, LLC and described in the patent documents, such as: U.S. Pat. Nos. 7,012,489, 7,649,432, 7,948,335, 7,148,772, 7,405,638, 7,656,256, 7,755,174, 7,898,356, 8,031,037, 2008/0199656 and 2011/0123783, 2010/0296252, 2011/0273241, 2011/0181376, 2011/0210807, the contents of which are incorporated herein by reference. The center conductor with an air dielectric is the lowest loss method for handling high speed digital and RF for frequencies at 100 Gb/s in a compact 3D RF transmission line.

The 3D coaxial signal conductor may be surrounded by ground shielding on all four sides in the case of rectacoax (or the surrounding outer conductor in any other coaxial shape) and may provide optimum isolation between two adjacent signal lines (each surrounded by metal shielding). Such a configuration can allow two adjacent 3D coaxial interconnects that are in extremely close proximity to handle high speed digital and mixed signals with the low crosstalk. (See FIGS. 1, 2 for examples of PolyStrata® architecture 91 having crossover lines 92 with high isolation. The metal shield separating adjacent signal traces provides much greater I/O routing and redistribution densities and higher impedance control than is available in the prior art for high-speed IC test applications.) Two center conductors suspending in an air dielectric and surrounded by ground shielding can provide an optimal approach for 100 Gb/s routing of differential signals. As integrated circuits are built with more transistors and operate at higher clock rate frequencies, much more noise is induced by the simultaneous switching action of millions or billions of transistors on the chip processing the data operations. This noise is coupled onto the DC power and ground supplies and can affect performance, especially bit error rate performance. The creation of a 3D coax or mostly air dielectric 3D coax differential signal pair with high common mode rejection will mitigate the effects of DC line noise.

Moreover, very small geometrical feature sizes can be achieved because the 3D coax is processed via photolithography, allowing connections and contactors to interface at very small pitches for high density interconnections. This can be critical for test interface units and contactors to directly contact semiconductor chip I/O or its interposer during testing with high density interconnections and very low crosstalk.

In another of its aspects, the present invention provides a test interface unit contactor to permit direct transition from a low-loss high isolation 3D coax interconnect to a metal probe that provides make-break contacts (i.e. mating cycles) to a substrate's connection pads for wafer level or multi-device testing. For purposes of this application, when we say wafer level testing we mean any suitable testing of die on a wafer where said die are tested one or several at a time. Sometimes said die may be tested in clusters of 4, 8, 16, 32 or more. Typically testing is accomplished by moving the wafer in a step and repeat manner until all die on the wafer are tested. The design and construction of the contactor may provide a compliant temporary connection to the wafer pads or bumps and allow for many more mating cycles to chips and wafer electrical contact points than would be possible mating the probe card directly to the device under test.

Additionally, the three-dimensional, controlled-impedance routing of the signal traces that is possible using 3D coaxial design and fabrication techniques means signal integrity may be maintained for even the most dense routing requirements, such as in wafer-level or multi-site testing. The layer-to-layer interconnects do not require more space than in-plane routed transmission lines (as is required for traditional multi-layer PCBs). Considering the routing on a Cartesian grid, routing architectures in accordance with the present invention could have, for each independent transmission line, and input in one XYZ "point A" and output in a completely new XYZ "point B", thus not being confined to any particular plane due to the 3D nature of routing using the substrate-free architecture. (See U.S. patent application No. 61/788,675 the entire contents of which are incorporated by reference.) For instance, the pitch in the input can be greatly reduced to accommodate a fine pitch die, employing coax to ground-signal-ground (GSG) transitions in order to reduce the pitch to less than 100 μm. Then the outputs of each individual coax line can be fanned out to a wider pitch some distance away from the mating make-break or connector connection—without losing signal integrity due to loss or isolation issues. The wider pitch allows standard connectors and cables to route the transmission line back to the main signal processing or higher level board controller tier, or to fit additional processing ICs directly on a PCB or flex circuit at the coax line outputs that are now spaced further apart. In phased array architectures this change in pitch accomplished by a redistribution network may be called a "dilation", and in semiconductor interposers this change is called a "fan-out" or space transformer.

In the case of both the antenna grid of a phased array or the IC pad or bump pitch of chip or wafer to be tested, interconnect challenge is primarily one of a roughly 2D planar grid of devices in a plane. Returning to the Cartesian model with a X and Y in the plane of the wafer, chip pads or bumps, or antennas and Z being the orthogonal "height" or "depth" axis, one would determine some typically periodic pitch, or periodicity, for the contact points in the X, Y plane, say on a 1 mm spacing on X and Y. In this case, the height or Z plane is the contact plane for the device under test or antennas with the origin at Z=0, +/− some tolerance due to manufacturing variability. If the electronics or connectors needed to interface to this grid require a contact surface area 10× this pitch, or for example, then require 10 mm×10 mm contact region to fit and mount their interface, then we are faced with the need to redistribute or reroute with our intermediary 3D redistribution structure. What is less apparent is it that this can be done in multiple planes and multiple ways.

For example, one solution in accordance with the present invention would be to have another plane defined at different Z, say Z=1 mm, and then have transmission lines simply route diagonally to a new XY grid on the 10 mm pitch with diagonal fan-out transmission lines. This a smaller "checkerboard" of contact points for the device under test (DUT) or antenna array is fanned out and "up" to the larger checkerboard at Z=1 mm on the XY pitch of 10 mm. This is one way to interface the large connectors with a mounting surface area which is 10× too large on two linear dimensions or 100× too large in surface area to this smaller grid for the DUT or antenna array. It can be noted however that only the DUT or antenna array is constrained essentially to a single Z-plane in this example, and the connectors could be distributed onto a multitude of larger surfaces to solve the problem. So, a fan-up to a checkerboard on 10× pitch on the XY plane at a Z=1 mm plane is one approach, but so is a fan out that is tiered with mounting surfaces on the XZ or YZ planes, or diagonal planes, or even over the surface of a hemisphere or pyramid. Any of these solutions can provide the ability to move from the small Cartesian grid of the DUT or antenna and spread out and up to a new surface or series of tiered surfaces on any of these planes. The most pragmatic solution to choose where and how the fan-out is achieved will in part be dictated by the manufacturing and assembly methods used to assemble the 3D transmission lines redistribution network.

In yet another of its aspects, the present invention may provide, at the input or output of each independent transmission line, a transition designed such that it provides mechanical or electrical connection to a standard RF connector. The connector could also be fabricated at the same time as the transmission line, or provide for an interlock mating surface for a COTS (commercial off the shelf) connector such as the G4PO® connection components offered by Corning. At the input or output of each independent transmission line, the transition can be designed such that it terminates in an antenna fabricated using the same methodology as was used to fabricate the transmission line, or there could be provided a mechanical interlock to the antenna. This arrangement could allow for coupling at distance to a device under test (DUT) or to conduct any other sensing or radar application.

PolyStrata® based architecture can also incorporate various passive components such as power dividers/combiners, filters, inductors, capacitors, couplers, and baluns. These components can be integrated at a terminal end (input or output) or in-line with the transmission line in order to process or condition the RF signals before routing to an external connection. In addition, the 3D coaxial transmission line structure can route many lines to active devices such as RF switches in order to minimize the RF processing needed in the overall testing system. Other active devices, such as but not limited to amplifiers, can be connected through appropriate transitions to the PolyStrata® architecture or other shielded distribution network to provide for RF processing before passing to external connections and processors. Switches, and RF switches in particular, can greatly reduce the amount of cabling and processing further into the testing system. As an example, a bank of 1×4 switches connected to the transmission lines leading to a DUT could reduce the amount of RF sources, receivers, cables, connectors, and other microwave passives and actives by 4 times. This reduction in components can simplify the testing assembly and minimize cost, assembly, and impact to system yield.

In still another of the aspects of the present invention, at the input end of the 3D coax lines, where the inner conductors meet the DUT pads, various make-break connection (contactor probe) designs can be fabricated or integrated. A design of the probe can feature a center conductor as well as an outer conductor, providing isolation shielding as close as possible to the DUT pad or solder bump or post. Alternative designs of the probes could be separately fabricated probe assemblies that are affixed to the 3D coax architecture either permanently or through compression interfaces held in place with precision screws or bolts or clamps or interlocking features. These multi-probe assemblies could be made using but not limited to: micro electro mechanical systems (MEMS), cantilevers, fuzz-button arrays, compliant springs, the PolyStrata® technology, pogo pins, or antenna elements.

By leveraging the 3D networking architecture provided, much higher densities of chips or devices under test (DUT) can be tested at one time, scaling this test interface unit to a true wafer-scale test interface unit. From 4 chips to 8, 16, 32, and up to entire wafers, the architecture lends itself to building out the structure in a large backplane to accommodate many thousands of connections.

BRIEF DESCRIPTION OF THE DRAWINGS

The foregoing summary and the following detailed description of exemplary embodiments of the present invention may be further understood when read in conjunction with the appended drawings, in which.

DETAILED DESCRIPTION OF THE INVENTION

Figure 3:
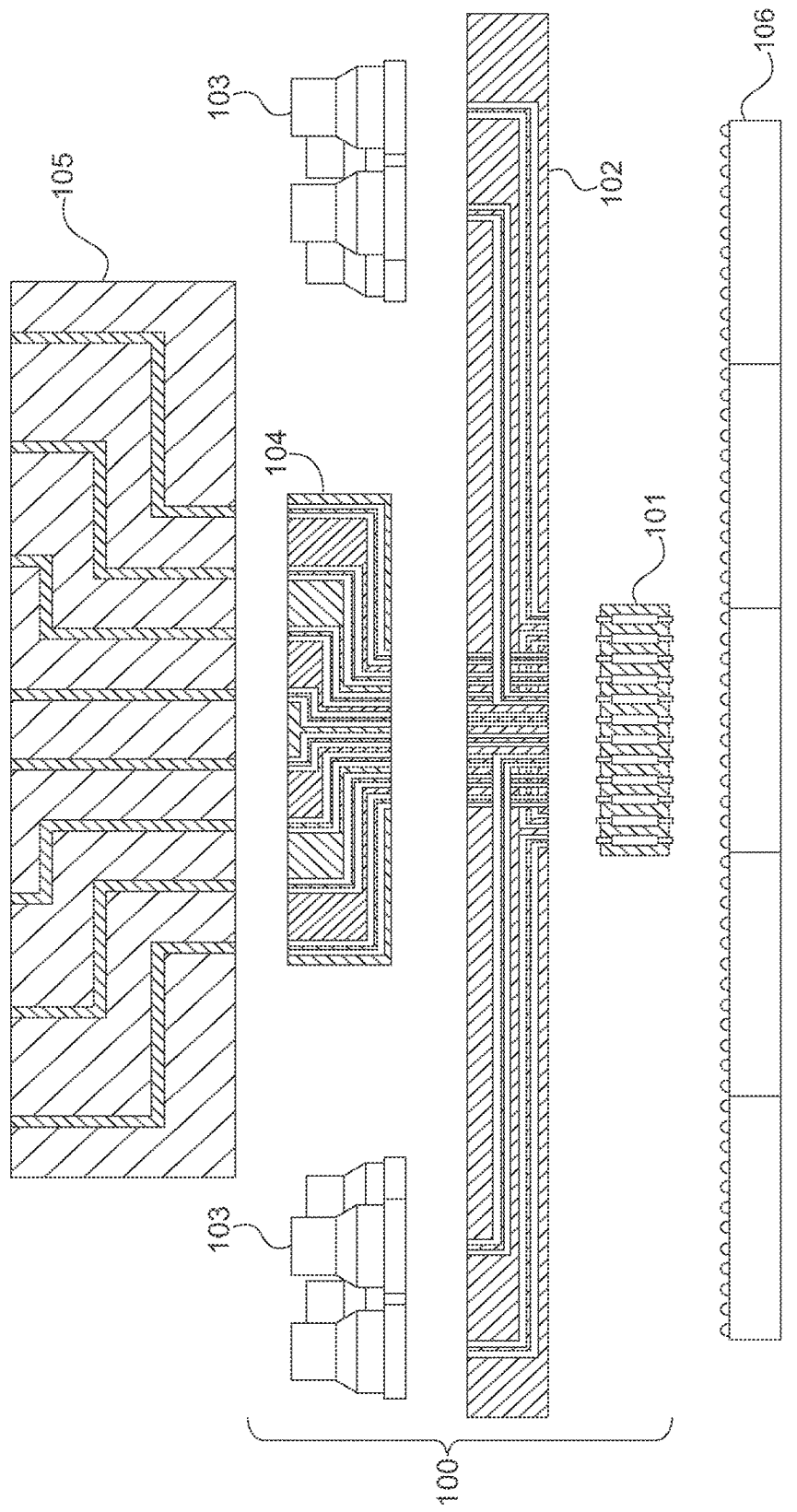
FIG. 3 schematically illustrates an exploded view of the components of an exemplary wafer level test interface unit in accordance with the present invention.
Figure 4:
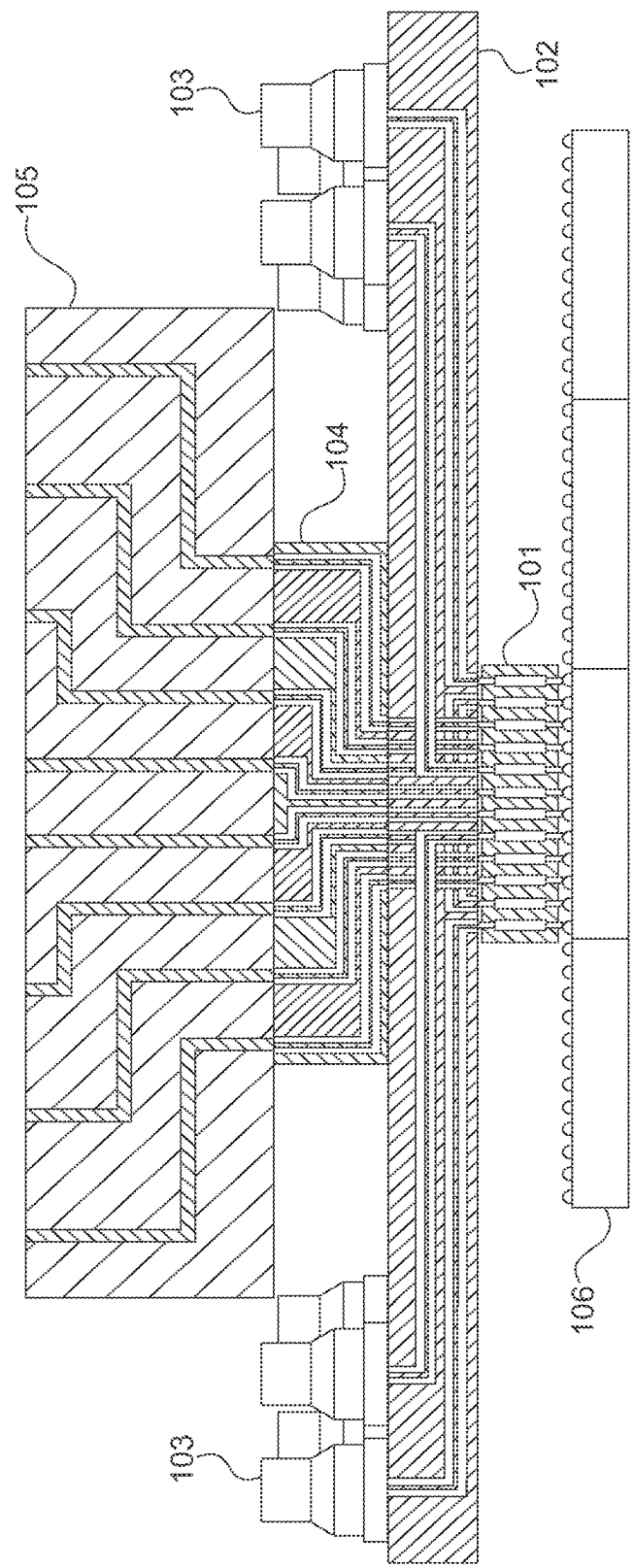
FIG. 4 schematically illustrates a cross-sectional, non-exploded view of the exemplary test interface unit of FIG. 3.

Referring now to the figures, wherein like elements are numbered alike throughout, FIGS. 3-4 schematically illustrate an exemplary configuration of a wafer level test interface unit 100 in accordance with the present invention for use in testing a device under test (DUT) 106. The wafer level test interface unit 100 may be configured to provide repeated testing of multiple devices under test 106, especially at the grid/wafer level, while overcoming numerous problems in the existing art. For example, typically, the device under test 106 will include RF and DC circuitry, which is typically tested through the use of a probe card assembly comprised of printed circuit boards 105 and a contactor array 101. (The printed circuit board 105 can represent a non-coaxial printed circuit card where processing or interfacing with active and passive components can be conducted close to the device under test 106.) However, the pitch of features on the device under test 106 is most often much finer than that achievable in the printed circuit board 105; thus, there may be a pitch mismatch between the device under test 106 and the printed circuit board 105 that needs to be addressed. Additionally and increasingly, devices under test 106 also include RF circuits which are difficult or impractical to test via the printed circuit board 105. Thus, the wafer level test interface unit 100 may be configured to accommodate both DC signal paths as well as RF signal paths. Consequently, the structure of the wafer level test interface unit 100 of the present invention may provide at least the following three features. First, the wafer level test interface unit 100 may be configured to include a dilation (a change in pitch) in the signal paths that matches the finer pitch of the device under test 106 to the relatively larger pitch of the printed circuit board 105. Second, the wafer level test unit 100 may include separate conductive pathways for each of the DC circuits on the device under test 106 and the RF circuits of the device under test 106. Third, the wafer level test interface unit 100 may be structured to permit repeated, mechanical/electrical make-break connections to each of the circuits of the device under test 106. This is an improvement in the art because of the highly improved electrical shielding while decreasing the minimum pitch possible by other approaches. The electro-mechanical nature of the construction that eliminates solid dielectric in part of all of the dilation also reduces RF signal loss and enables the opportunity to directly create a mechanically compliant interface region in the hardware.

For example, in one exemplary configuration the wafer level test interface unit 100 may include a plurality of structures that provide the aforementioned features. The make-break connections with the device under test 106 may be made by a contactor probe assembly 101; the dilation of the DC lines of the device under test 106 to the printed circuit board 105 may be accomplished by an interposer 104; and, dilation of the RF circuits of the device under test 106 as well as routing of both the DC circuits and RF circuits from the device under test may be provided by a 3D probe interface layer 102 having RF connectors 103. While each of the three features of dilation, make-break connection, and RF signal routing may be provided by three separate structures 101, 102, 104, other configurations are possible in which the three separate structures 101, 102, 104 are provided by a unitary monolithic part.

Figure 5:
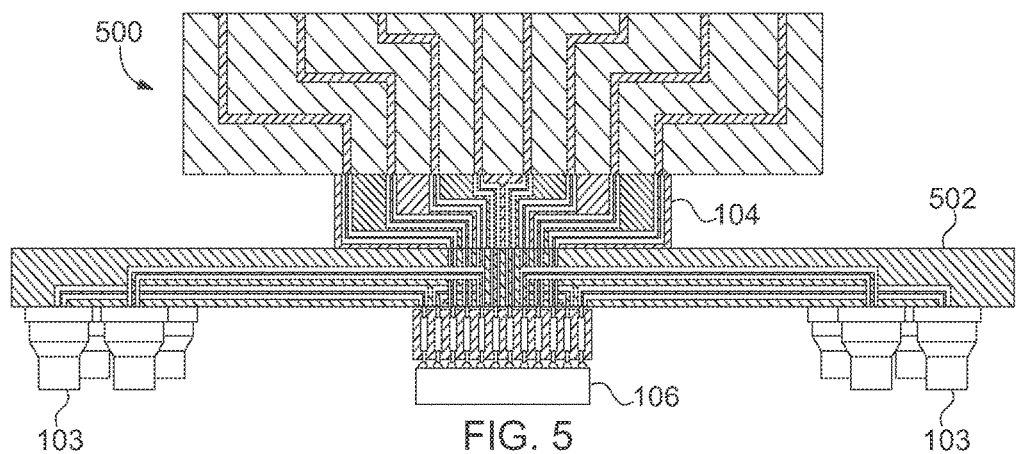
FIG. 5 schematically illustrates an alternative configuration of the test interface unit of FIG. 3 but having a different orientation of RF connectors relative to the device under test.

In addition, as examples of other exemplary configurations of wafer level test interface units in accordance with the present invention, a wafer level test interface unit 500 may include a probe interface layer 502 which routes the RF signal from the device under test 106 to a lower surface of the probe interface layer 502 to position the RF connectors 103 at such lower surface, FIG. 5. Such a configuration may offer more room for assembly of a test interface unit, because the RF connectors 103 are routed to the opposite side of the probe interface layer 502 to the DC signals which pass through the interposer 104. Such a configuration may be suitable for testing singulated or grids of die or multi-chip module (MCM) devices that require testing allowing clearance between the connectors and the DUT. Further, a wafer level test interface unit 600 similar to that shown in FIG. 3, may optionally include an interposer 117 disposed between the RF connectors 103 and probe interface layer 102 to provide enhanced mechanical rigidity to the assembly as well as additional room for DC and/or RF routing and/or embedded or surface mount passive or active circuits. The interposer 117 may comprise an alumina board, printed circuit board, or any other suitable material to provide electrical contact between the connectors 103 and probe interface layer 102.

Figure 7:
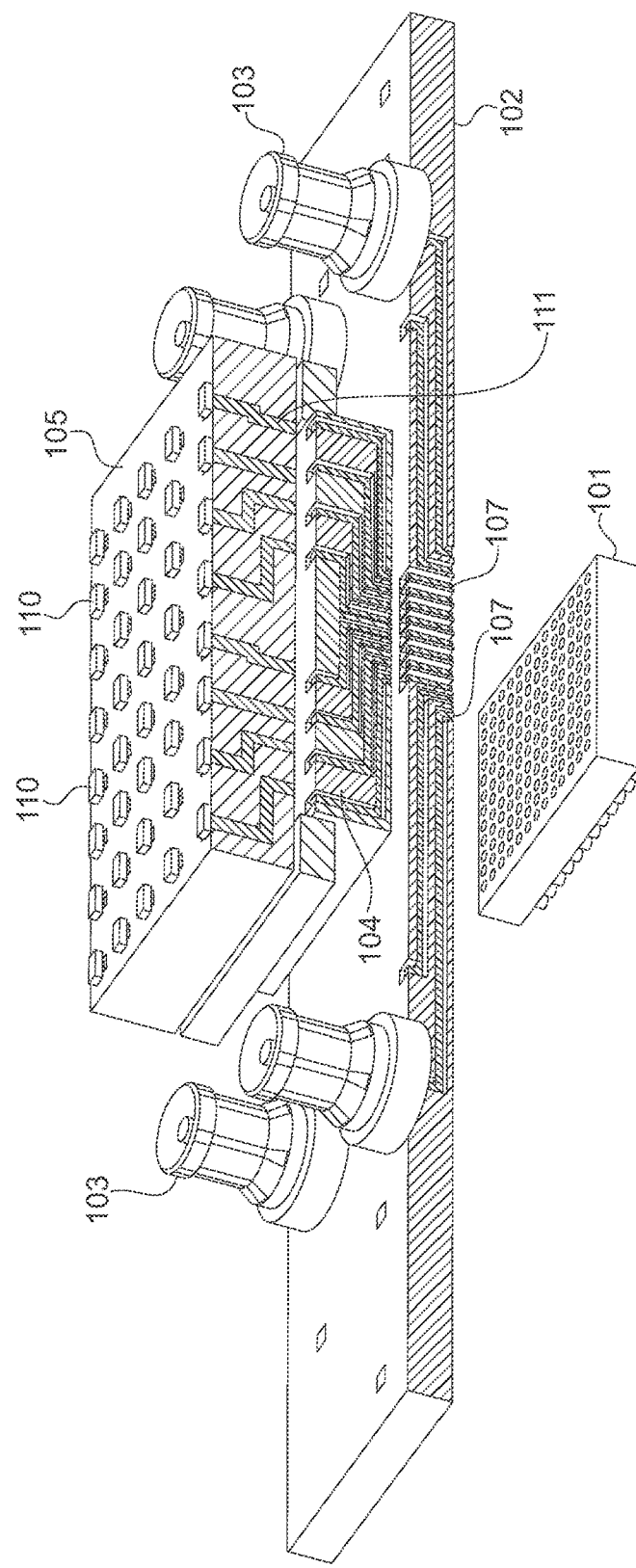
FIG. 7 schematically illustrates a 3D plan view in partial cross-section of the test interface unit of FIG. 3.
Figure 8:
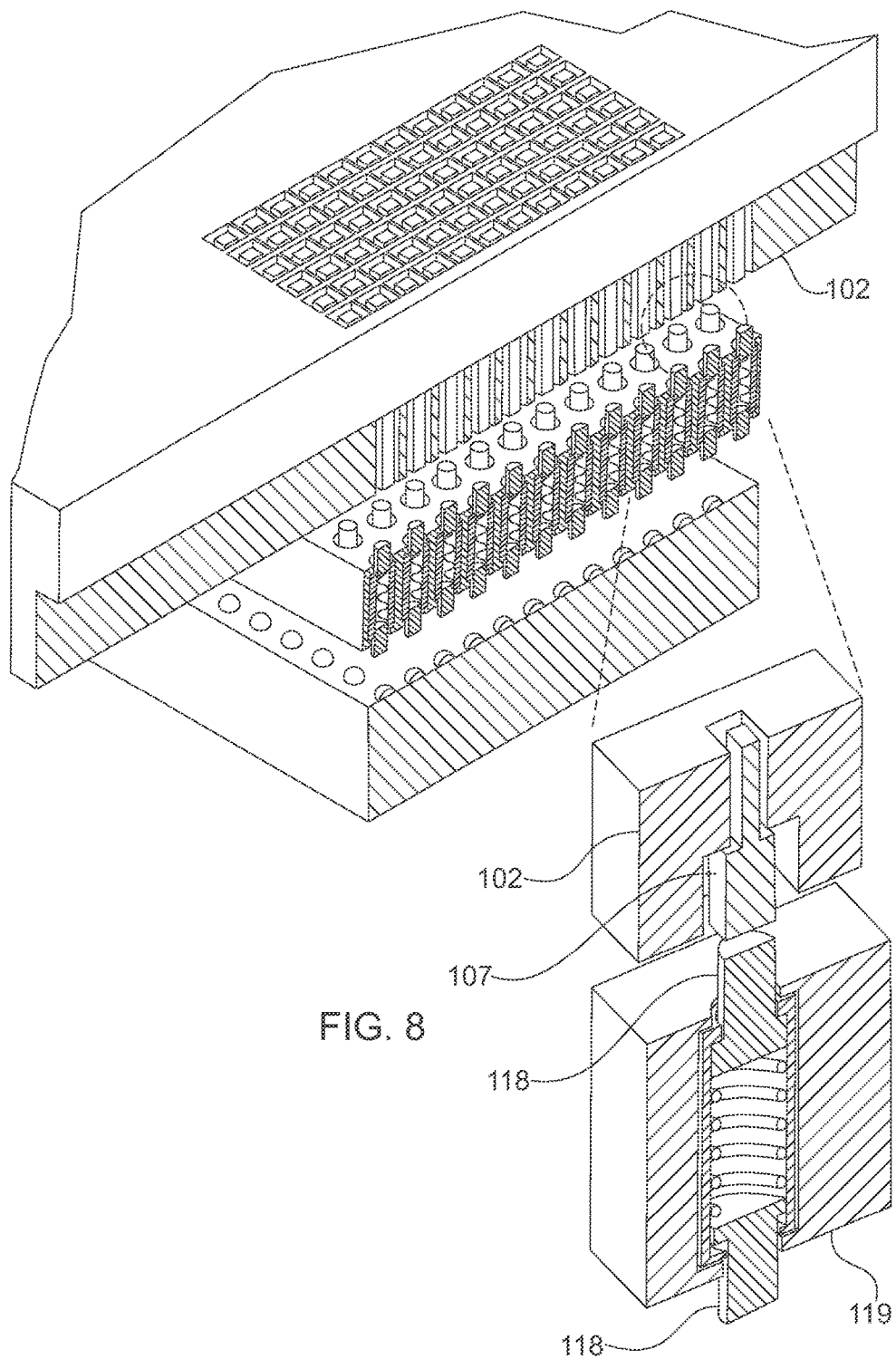
FIG. 8 schematically illustrates enlarged detailed views of portions of the features of the test interface unit of FIG. 7.

FIG. 7 schematically illustrates a 3D plan view in partial cross-section of the test interface unit of FIG. 3, further showing the routing of the coaxial lines 107 within the probe interface layer 102 and interposer 104, as well as the non-coaxial transmission lines 111 through the printed circuit board 105. Active or passive components 110 may be provided on the top or embedded in the circuit board 105. 105 may also serve as an interface contact layer to an upper probe card or connector layer. Such an upper probe card and the DC board 105 may pass power and I/O to the DUT and interface to the test system electronics that otherwise do not require shielded transmission lines to interface to the rest of the test system. Additional detail of the interface between probe interface layer 102, contactor probe assembly 101, and the device under test 106 is illustrated in FIG. 8. Specifically, the contactor probe assembly 101 may include pogo pins 113 disposed in a housing 119. An array of such pogo pins can be made such as a using a clamshell sheath with holes to form a complaint connector layer 101. The pogo pins 113 may be configured to provide electrical and mechanical connection between individual solder bumps or pads on 112 of the device under test 106 on one side and respective center conductors 107 of the probe interface layer 102. In FIG. 8 on the right a small perspective cross-section of 3D probe interface layer 102 is shown to highlight a shielded RF transmission line 107 of the probe interface layer 102 electrically interfacing with the center of a compliant contactor 118, in this case being represented with a double-sided pogo pin, with only the upper contactor shown 118 of pogo pin 113. An example of the dilation aspect of the probe interface layer 102, which assists in routing of the DC and RF signals as well as matching the pitch between the device under test 106 and a printed circuit board 105, may further be seen and described in FIG. 25.

Figure 9:
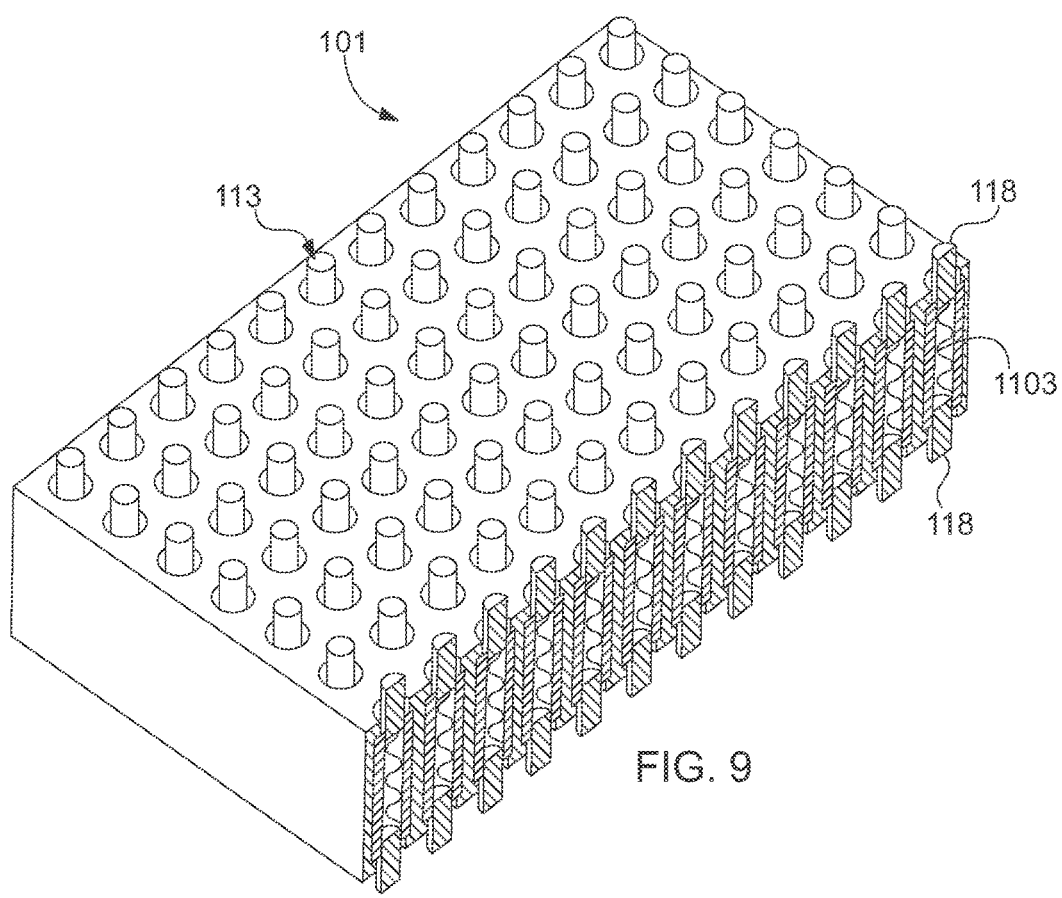
FIG. 9 schematically illustrates a cross-sectional view of the probe assembly of FIG. 7.
Figure 10:
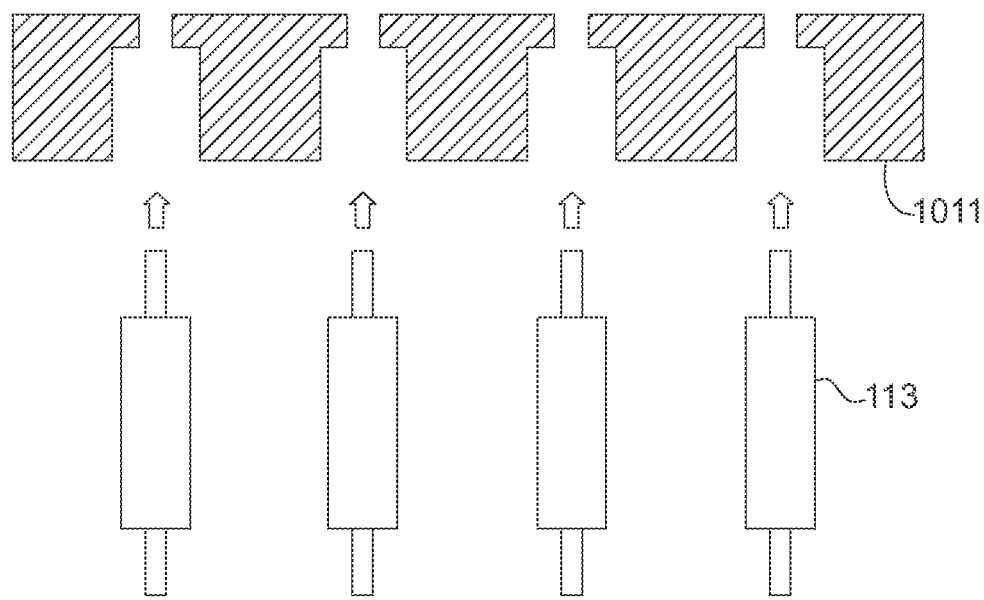
FIG. 10 schematically illustrates an exploded, cut-away view in partial cross-section of the probe assembly of FIG. 9 showing the pogo pin and associated housing.
Figure 11:
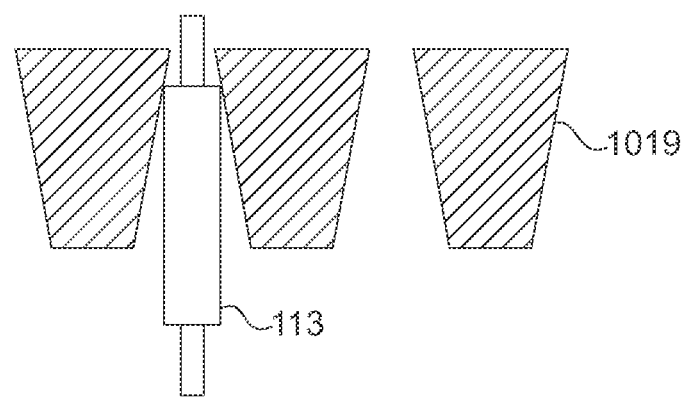
FIG. 11 schematically illustrates, in partial cross-section, an alternative exemplary probe assembly having a tapered housing in accordance with the present invention.
Figure 12:
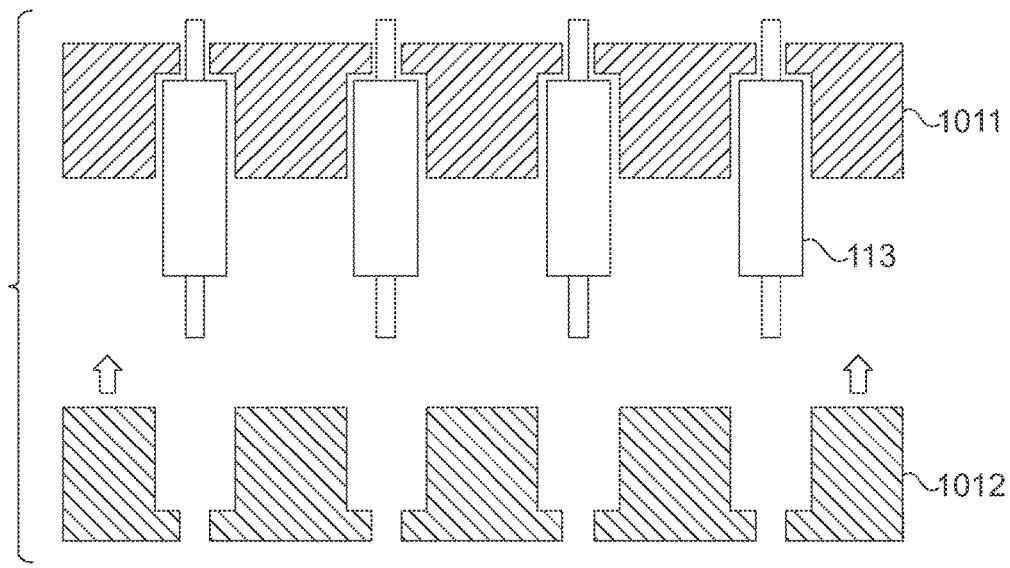
FIG. 12 schematically illustrates exploded view in partial cross-section of an exemplary probe assembly in accordance with the present invention.
Figure 13:
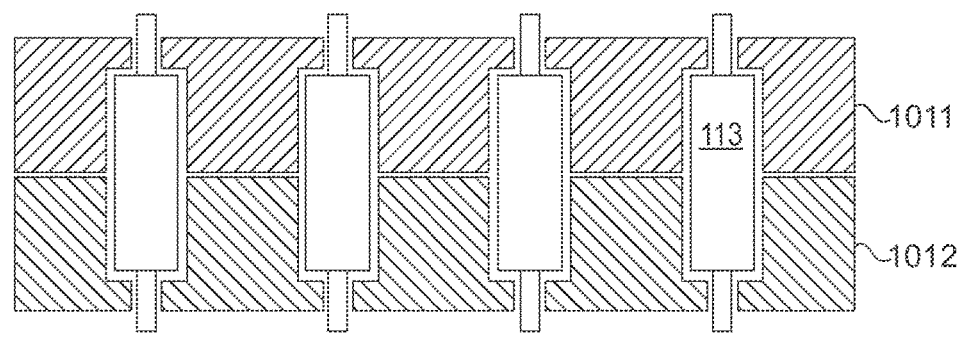
FIG. 13 schematically illustrates a non-exploded view of the probe assembly of FIG. 12.

The contactor probe assembly 101 may be attached to the probe interface layer 102 by solder, glue, epoxy, or may simply rely on mechanical contact. An adhesive material such as these could affix the lower outer surfaces of 102 to 101. 101 may or may not be made of a conductive material depending on the construction of the pogo pin and housing. The upper surface of the pogo pin 113 may be flat or have any shape suitable for improving mechanical and electrical connection between the center conductors 107 of 102 on one side and also the contact surface of the DUT on the opposing side. In this case FIG. 9 shows details of a "bed of nails" concept using and 2D array of double-sided compliant interface connectors in a housing structure to form 101. 101 is here comprised of a quantity of double-ended spring loaded contactors/connectors (pogo pins) where 118 is the central contactor of each pogo pin 113. A double-sided pogo pin as shown in FIG. 9 is comprised on two contactor ends 118, an internal spring 1103, and a housing 119. Single-sided pogo pins may be used as shown in FIG. 7 item 101. Other exemplary configurations of the probe interface layer 102, especially alternative configurations of the housing for the pogo pins 113, are illustrated in FIGS. 10-17.

Figure 14:
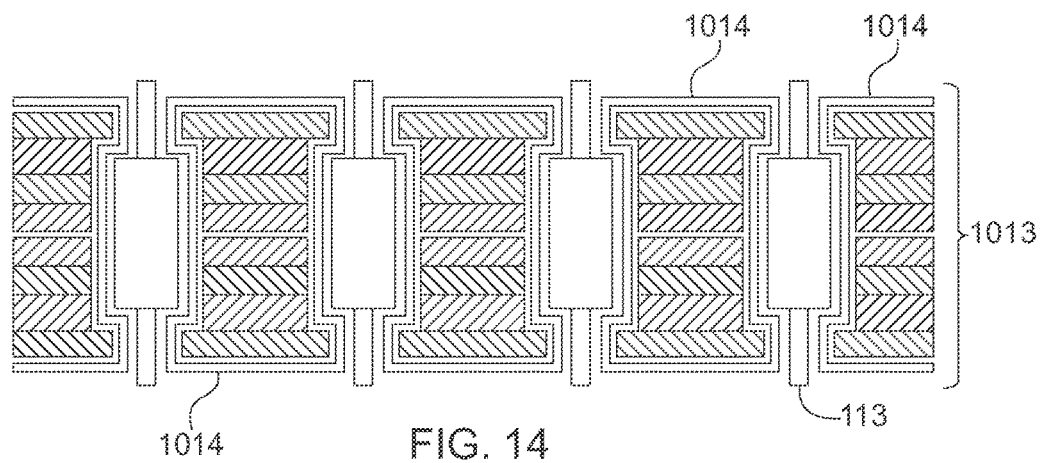
FIG. 14 schematically illustrates a cut-away view in partial cross-section of an exemplary probe assembly of the present invention comprising layers formed by the PolyStrata® process.
Figure 15:
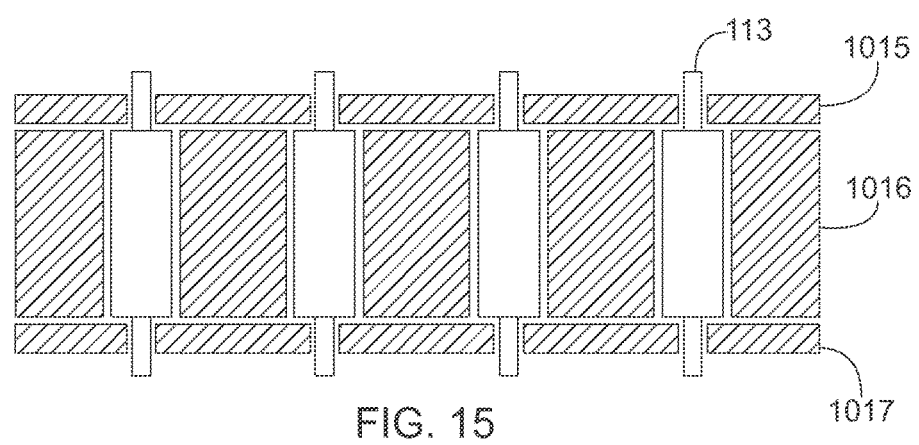
FIG. 15 schematically illustrates a cut-away view in partial cross-section of an exemplary probe assembly of the present invention comprising a three-piece, stacked housing.

FIGS. 10-13, for instance, schematically illustrate cutaway views in partial cross-section of the contactor probe assembly 101 showing a double-sided pogo pin 113 and associated upper housing portion 1011 and lower housing portion 1012. The housing portions 1011, 1012 may be fabricated from a non-conductive material, such as alumina, glass, or any suitable ceramic material, or a semiconductor material. The housing portions 1011, 1012 may be fabricated by dry etching, deep reactive ion etching, and/or laser drilling. The upper housing portion 1019, and/or lower housing portion, may include a diameter step or a tapered via, FIG. 11. Further, rather than upper and lower housing portions 1011, 1012, the housing may include upper, lower, and intermediate housing portions 1015, 1016, 1017, FIG. 15. The intermediate housing portion 1016 may be larger than the upper and lower portions 1015, 1017, so that, when assembled, the pogo pin assemblies, are trapped between the upper and lower housing portions 1015, 1017. As an alternative fabrication approach, the housing 1013 of the contactor probe assembly 101 may be fabricated using PolyStrata® technology with additional passivation 1014 to prevent electrical contact between the pogo pins 113 and the conductive strata of the housing 1013 as shown in FIG. 14. Other methods of manufacture may include 3-D printing of appropriate materials.

Figure 16:
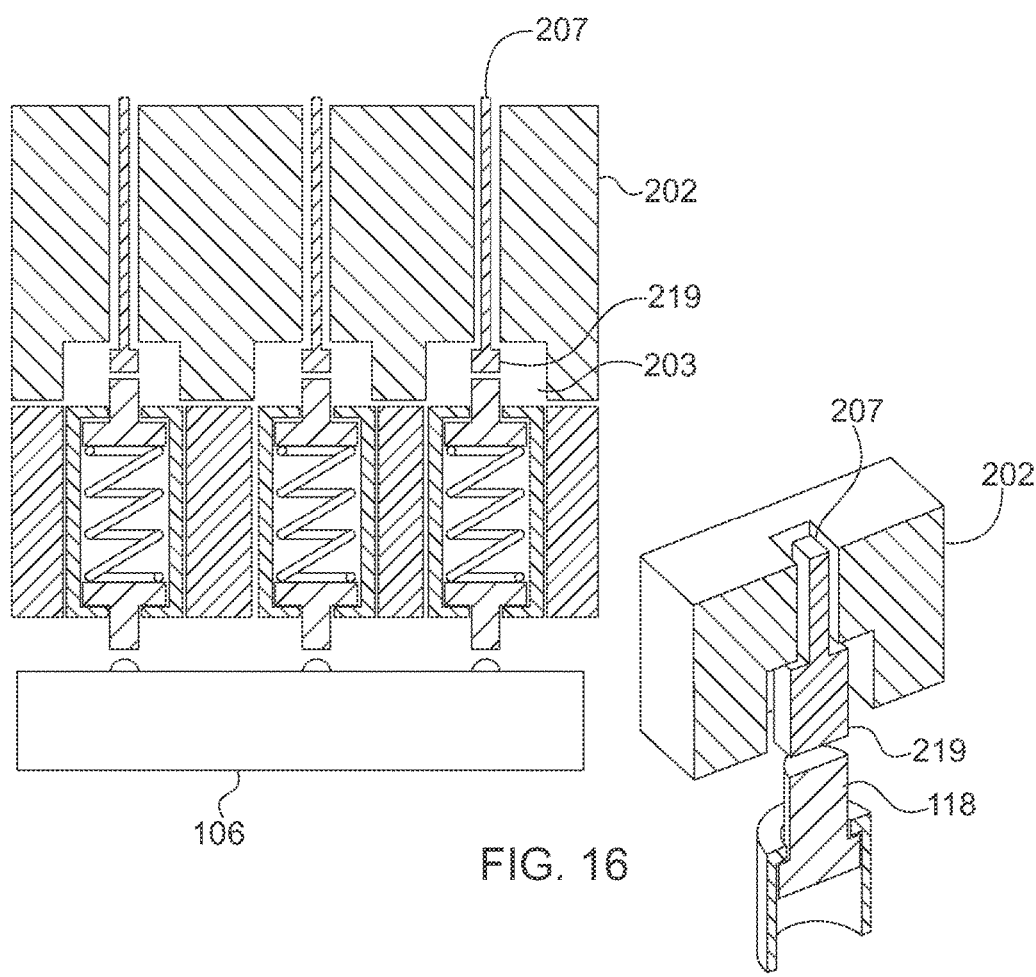
FIG. 16 schematically illustrates cross-sectional views of alternative configurations of an exemplary probe interface layer in accordance with the present invention having recessed conductor areas disposed in the probe interface layer.
Figure 17:
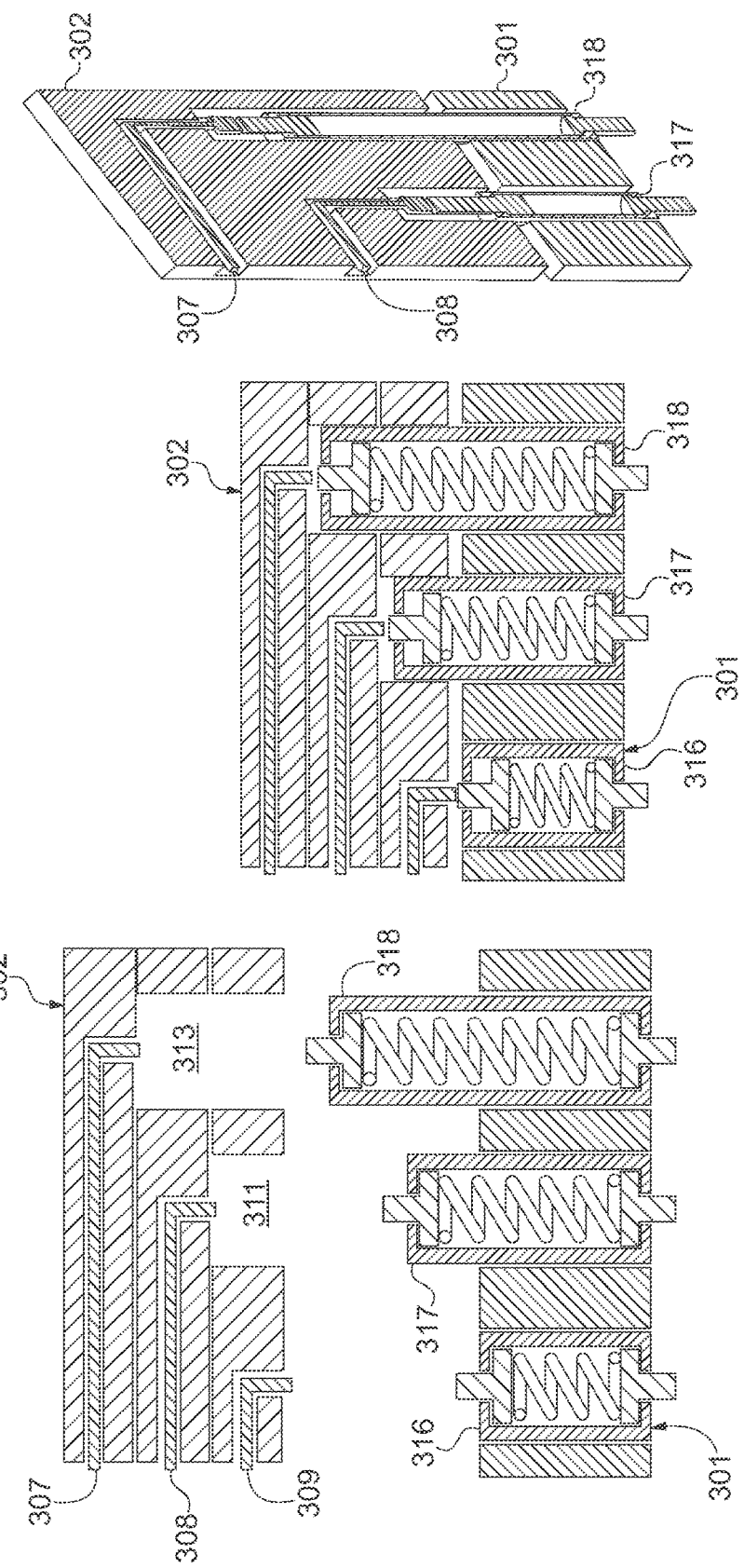
FIG. 17 schematically illustrates cross-sectional views of alternative configurations of a probe assembly and probe interface layer in accordance with the present invention having multi-level, recessed conductor areas disposed in the probe interface layer.

In addition to variations in the configuration of the contactor probe assembly 101, variations in the structure of the probe interface layer 102 may also be desirable. For example, FIG. 16 schematically illustrates cross-sectional views of an alternative configuration of the probe interface layer 202. The probe interface layer 202 may include center conductors 207 which include enlarged end portions 219 which may improve electrical and mechanical contact between the center conductors 207 and pogo pins 113. At the same time, center conductors 207 can have a smaller cross-sectional width and the enlarged end portions 219, which provides additional room for, and thus more effective routing of, the center conductors 207 within the probe interface layer 202. In addition the enlarged end portions 219 may be recessed and protected within cavities 203 of the probe interface layer 202. In FIG. 17, the probe interface layer 302 may include center conductors 307, 308, 309 that terminate at differing heights within the probe interface layer 302, for example within cavities 311, 313 of the probe interface layer 302. At the same time, contactor probe assembly 301 may include pogo pin assemblies 316, 317, 318 of differing heights matched to the termination heights of the respective center conductors 309, 308, 307 to which such pogo pin assemblies 316, 317, 318 are to make electrical and mechanical contact.

Figure 18:
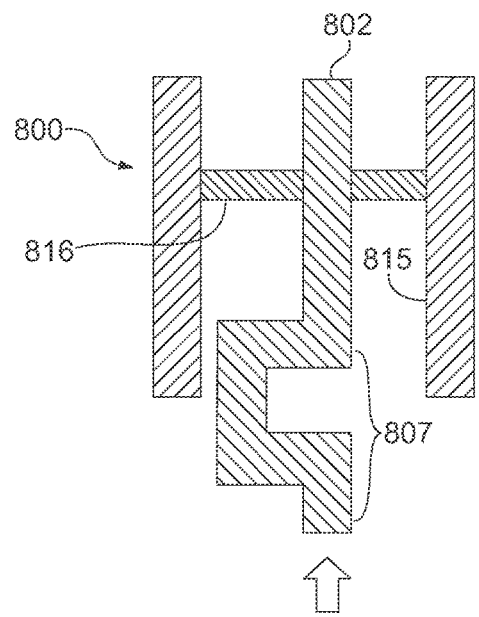
FIGS. 18-24 schematically illustrate cross-sectional views of exemplary probe assemblies in accordance with the present invention.
Figure 19:
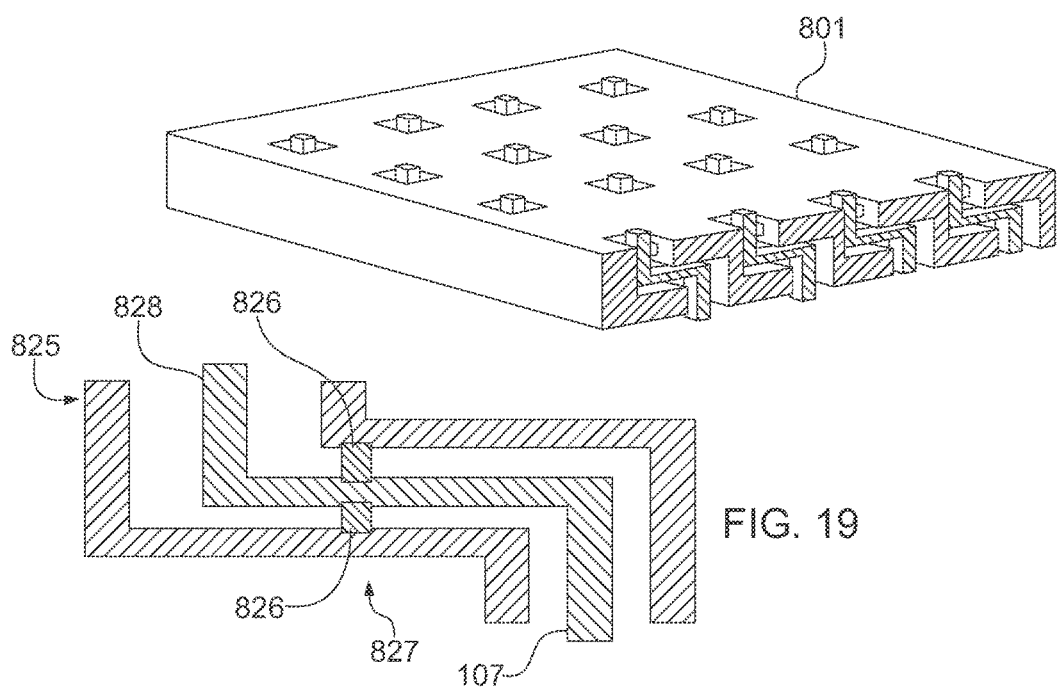

Still further, in addition to pogo pin assemblies, structures other than pogo pins 113 may be utilized within contactor probe assemblies 101 of the present invention, such as PolyStrata® center conductor springs 807. Using the center conductor to make a compliant layer can be accomplished in multiple ways. For example, FIG. 18 schematically illustrates a cross-sectional view of section of an exemplary probe 800 in accordance with the present invention having a center conductor 802 with a spring region 807, which may be fabricated by the PolyStrata® process. Specifically, the probe assembly 800 may include a center conductor 802 disposed within an outer conductor 815 to provide a coaxial structure. The center conductor 802 may include a spring portion 807 which can flex or deflect allowing compressive movement of the center conductor 802 in region 807 when contacting a device under test. The center conductor 802 may be supported within the outer conductor 815 by a dielectric support 816. Such a spring may be one or more repeated C sections meandering in a plane or a 3D spiral, for example. Alternatively, a coaxial center conductor 828 of a probe assembly 825 in accordance with the present invention may include a cantilever region 8027 about which the center conductor 828 pivots or rotates or flexes being affixed in regions 826 by a non-conductor, FIG. 19.

Figure 20:
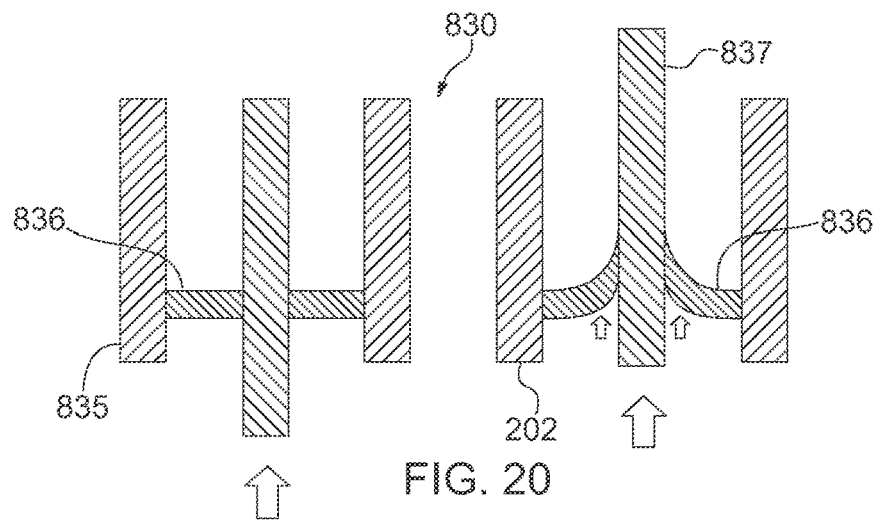
Figure 21:
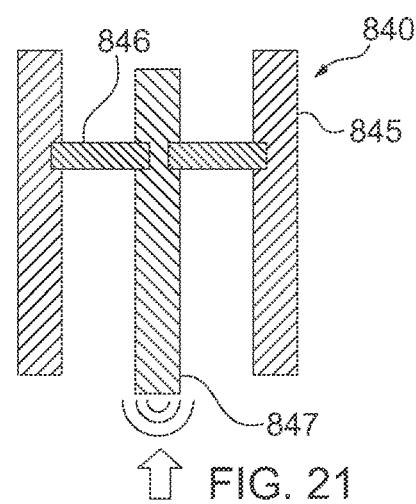
Figure 22:
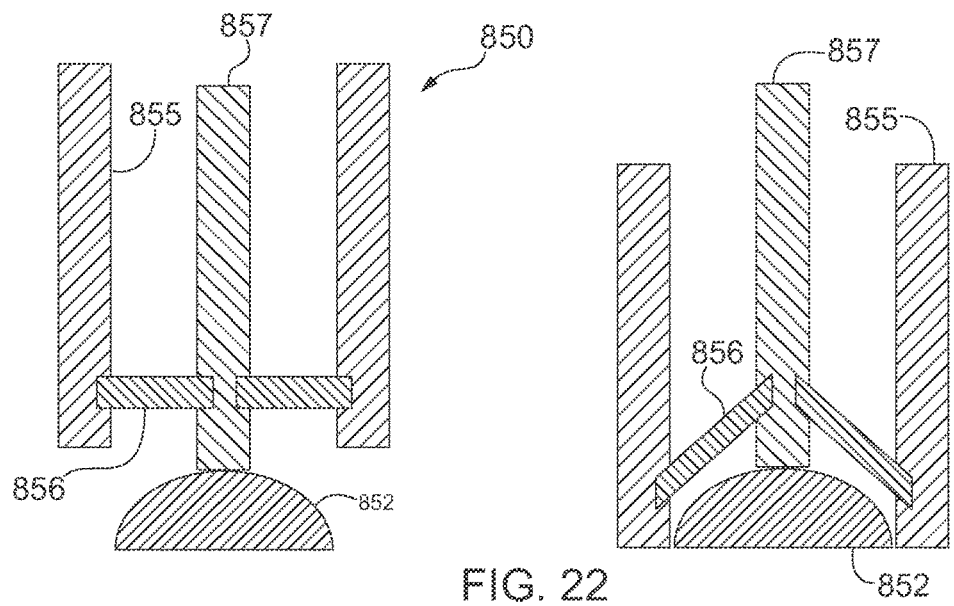
Figure 23:
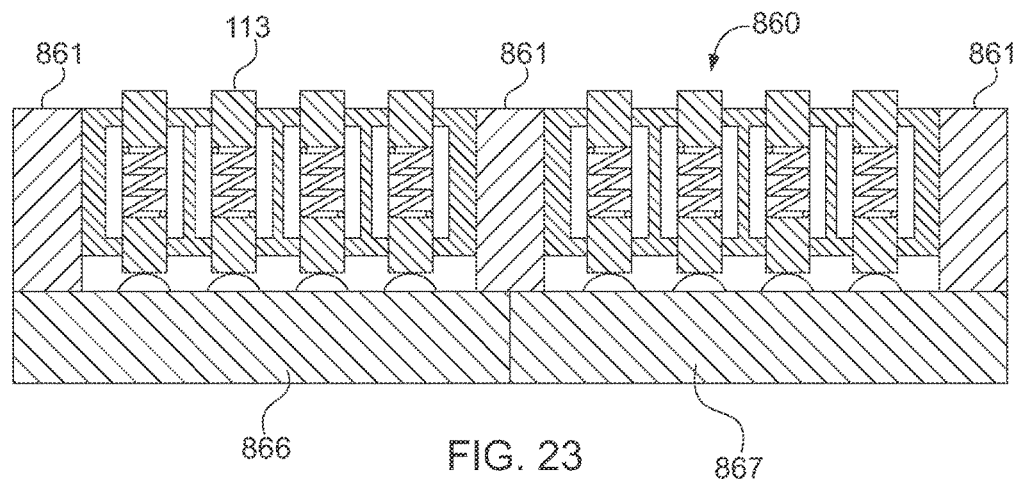

Additionally, in FIG. 20, movement of a coaxial center conductor 837 within a probe assembly 830 may be affected by flexure or bending of a dielectric support member 836 disposed between the center conductor 837 and the coaxial outer conductor 835, FIG. 20. In FIG. 22, instead of bending, a dielectric support member 856 may be provided between a coaxial center conductor 857 and outer conductor 855, which support member 856 pivots to allow movement of the center conductor 857, FIG. 22. In addition, the center conductor 857 can move a sufficient amount relative to the outer conductor 855 to permit a solder bump 852 of the device under test to be shielded within the coaxial outer conductor 855 of the probe assembly 850. Still further, in FIG. 21, probe assemblies 840 of the present invention may operate without physical contact between a coaxial center conductor 847 and the device under test. Instead the coaxial center conductor 847 may be configured to operate as an antenna which communicates with the device under test. The coaxial center conductor antenna 847 may be disposed within a coaxial outer conductor 845 and supported therein by a dielectric support member 846, FIG. 21. In FIG. 23, probe assemblies 860 of the present invention may also include shielding, such as shield walls 861, to minimize crosstalk within the probe assembly 860 between two neighboring devices under test 866, 867, which facilitates multi-site, or multichip, or wafer-level testing, FIG. 23.

Figure 1:
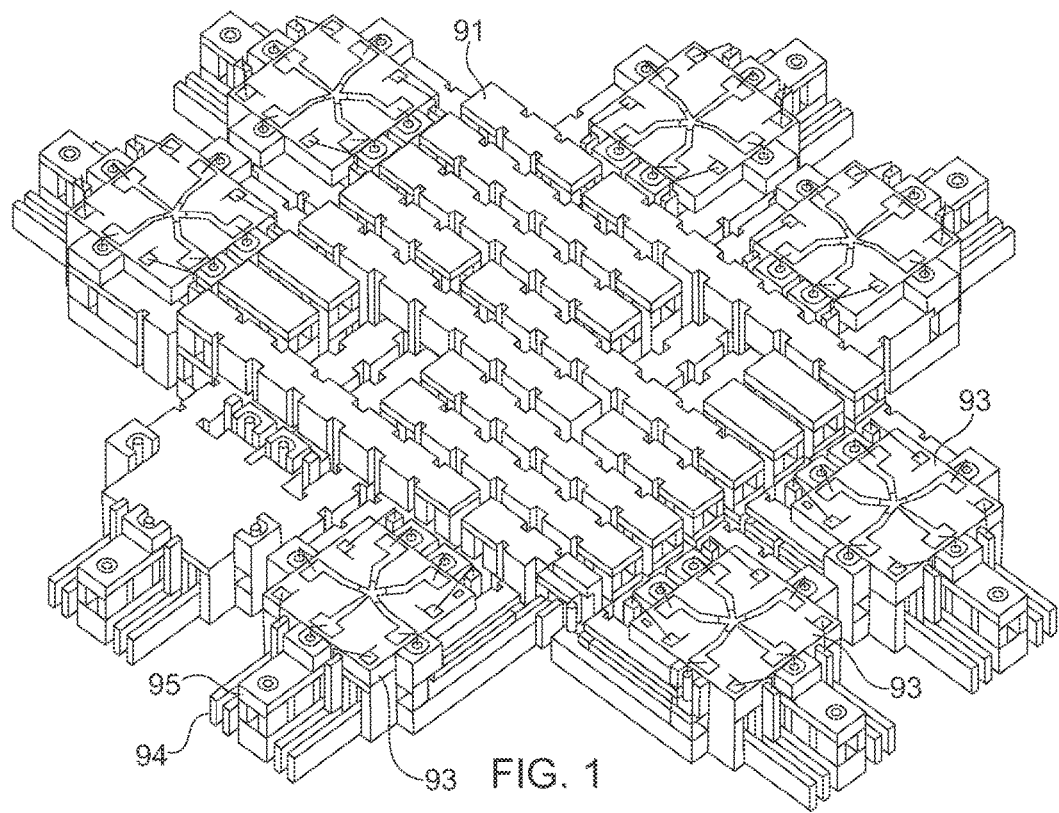
FIG. 1 schematically illustrates a 3D plan view of an exemplary 4×4 switch matrix comprising 3D coax PolyStrata® architecture in accordance with the present invention.
Figure 2:
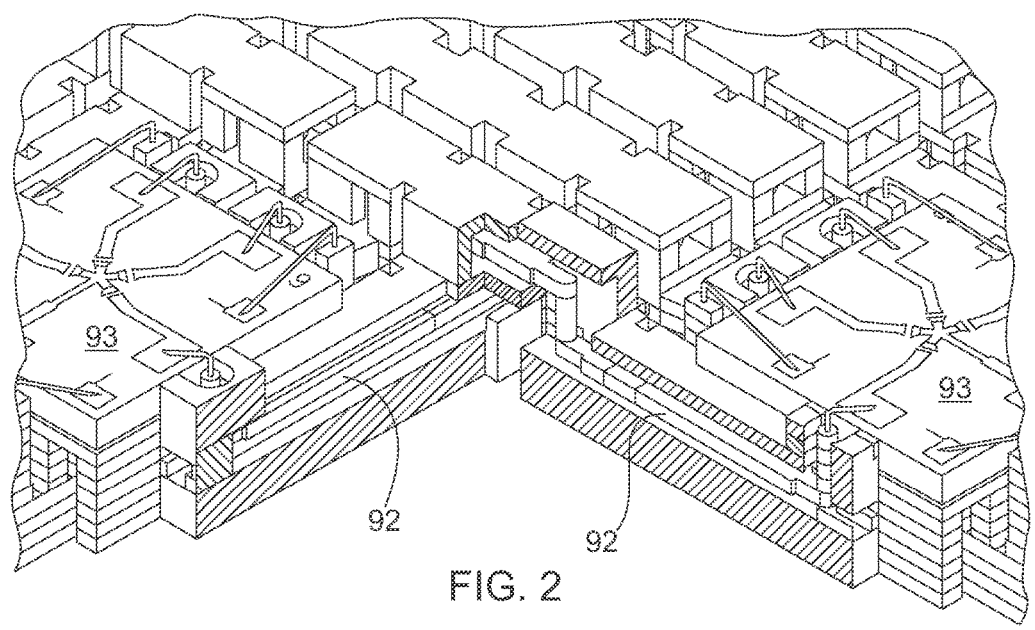
FIG. 2 schematically illustrates a partially cutaway view of the exemplary 4×4 switch matrix of FIG. 1 showing the detail of a 3D coaxial PolyStrata® line crossover in the overall PolyStrata® architecture.
Figure 6:
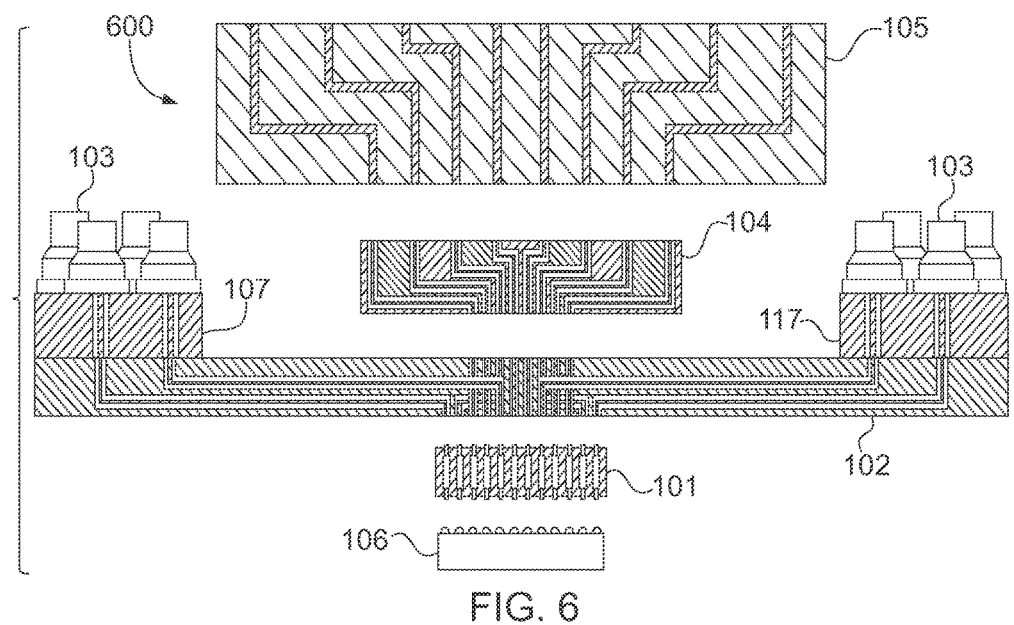
FIG. 6 schematically illustrates an exploded view of the components of an exemplary wafer level test interface unit in accordance with the present invention similar to that of FIG. 3, but having an interposer disposed between connector and the DC/RF dilation.
Figure 24:
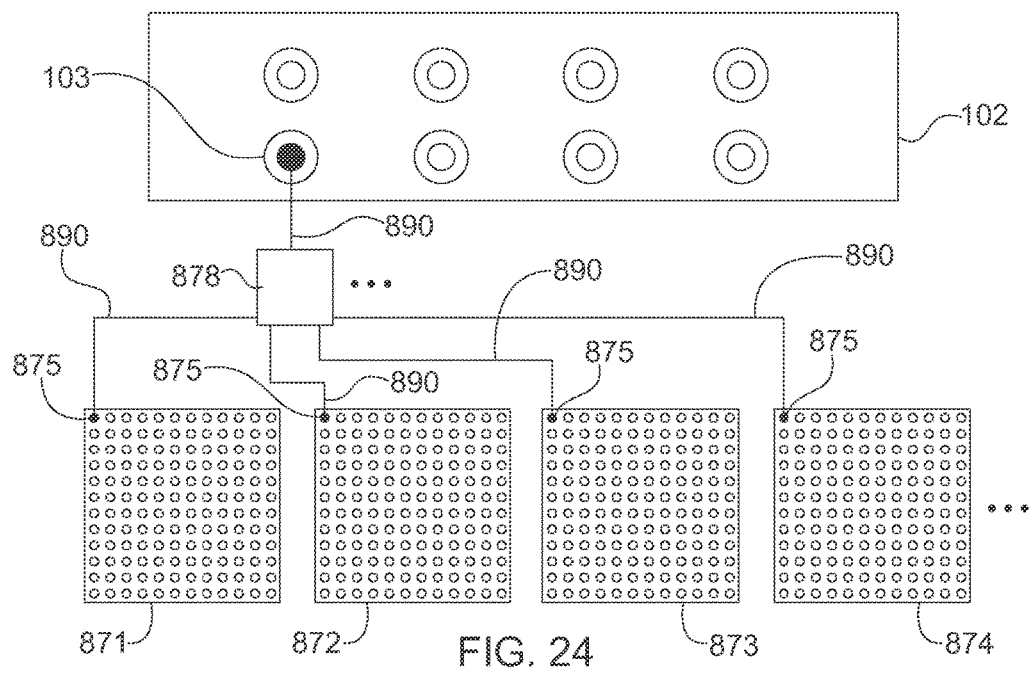

To further facilitate multi-device testing, a switch 878, which may be a MEMS switch, may be provided between multiple devices under test 871-874 and an RF connector 876. FIGS. 1 and 2 illustrate a perspective view and detailed close up section of a 4×4 non-blocking switch matrix. In FIG. 1 there are 8 ports with coaxial input regions, two on each of the 4 sides of the device. The switching is done with 1×4 (SP4T) RF-MEMS switches 93 in this case using 8 parts number RMSW240 obtained from Radant MEMS in Littletown, Mass. To create a non-blocking 4×4 switch matrix, all of the binary coaxial wiring interconnecting these eight 1×4 switches is done using PolyStrata® Coaxial network which also provides all the RF shielded coaxial cross-overs. FIG. 2 highlights how the MEMS s 93 are in this case mounted face up and interconnected using wirebonds. Flip-chip could also be used to attach such switches to the PolyStrata switch fabric. To the left and right of the 8 RF I/O launches into and out of the matrix 95, the DC control lines needed to operate the switch can also be seen, 94. FIGS. 1 and 2 thus illustrate ways to incorporate die level switches into a coaxial routing fabric. Similarly FIG. 24 shows in a block diagram format each of a plurality of RF outputs 875 on a respective series of devices under test 871-874 (also shown as 106 in FIG. 3) may be connected to the switch 878, which in turn may be selectively connected to a probe interface layer 102 in accordance with the present invention. Thus, the number of connectors 103 and cabling could be reduced by integrating switches 878 with the probe interface layer 102 or the optional interposer 117 as shown in FIG. 6. Without switching, separate RF and DC coaxial lines (and RF connectors 103) are required for each corresponding circuit of devices under test 106 which increases the complexity and cost of the contactor probe assembly. It should be clear that RF and DC switches can be integrated on any surface or even within the PolyStrata® fabric 102 or could be added in other locations as needed to tester assembly. In addition, the switch 878 and/or the coax lines 890 may be disposed within probe interface layer 102 or on the surface thereof. Furthermore, while the switch 878 and the coax lines 890 illustrated in connection with the probe interface layer 102, the switch 878 and/or the coax lines 890 may be disposed within the interposer 104 or on the surface thereof or on the surface thereof.

Figure 25:
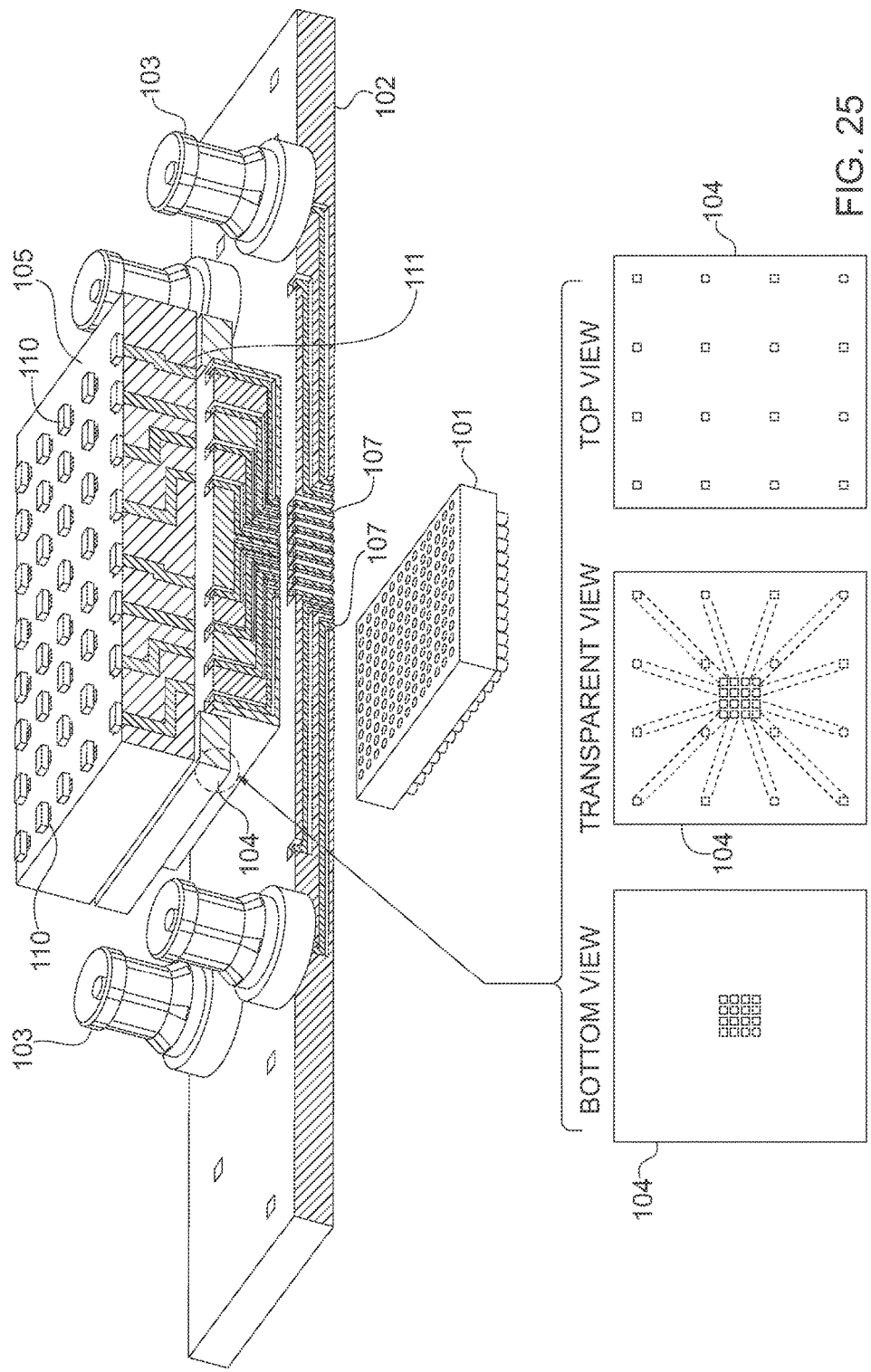
FIGS. 25-30 schematically illustrate an exemplary wafer level test interface units in accordance with the present invention for testing one or more devices, respectively, and showing how the wafer level test interface unit of the present invention scale with test device number.
Figure 26:
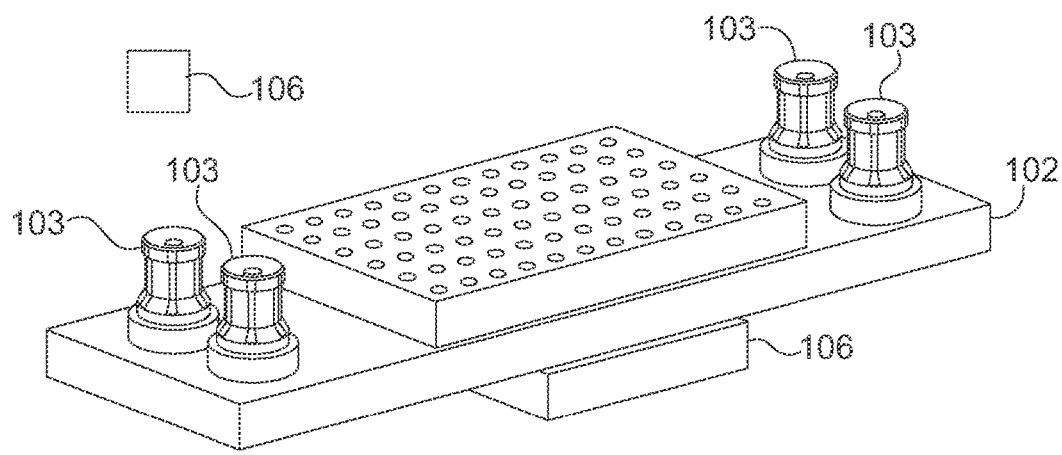

FIG. 25 depicts the fanning out process using the air-coax structure. The bottom view shows the small pitch of the contact point, the transparent view shows the fanning out and re-routing happening in the probe interface layer 102. The top view shows the new position of the contact after the fanning out. FIG. 26 shows the RF or DC being routed on each side of the probe interface layer 102.

Figure 27:
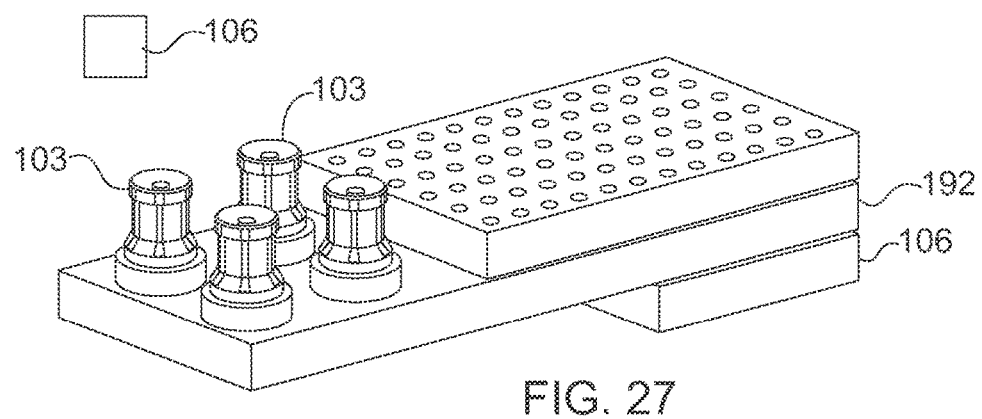
Figure 28:
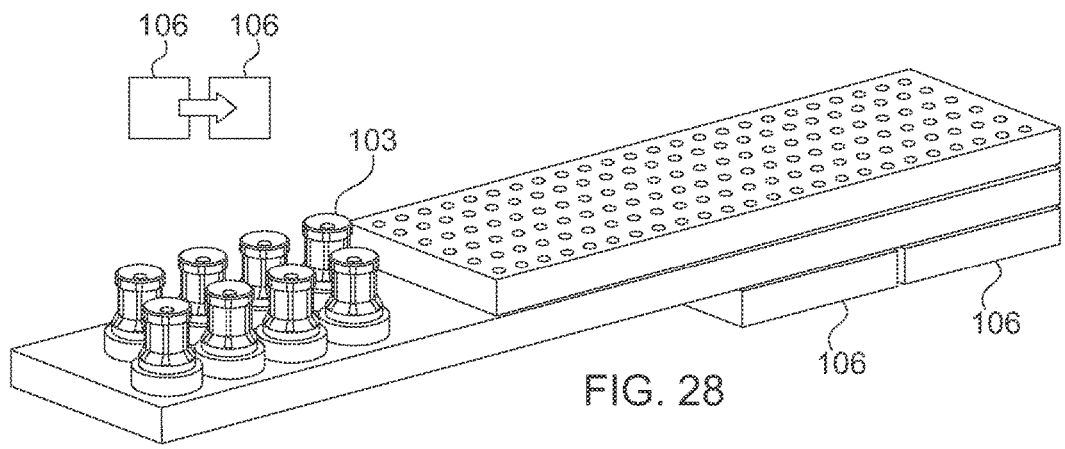
Figure 29:
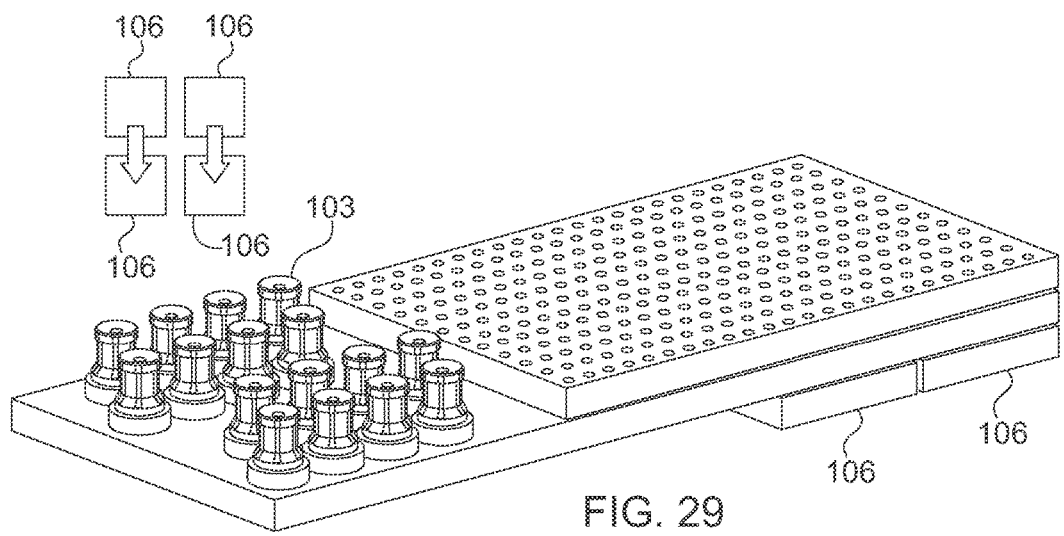

FIG. 27 shows that the routing density and high isolation offered by the coax lines allow for all the RF or DC lines to be routed on only one side of the probe interface layer 102, enabling a larger number of DUT 106 to measure at the same time. FIG. 28 shows that the dimensions of the 3D coax-line routing can be miniaturize enough to route two DUTs side by side to only one side of the probe interface layer 102. FIG. 29 shows 4 DUTs being probed, demonstrating the possibility to scale the number of devices to be tested simultaneously by duplicating the structure in FIG. 28.

Figure 30:
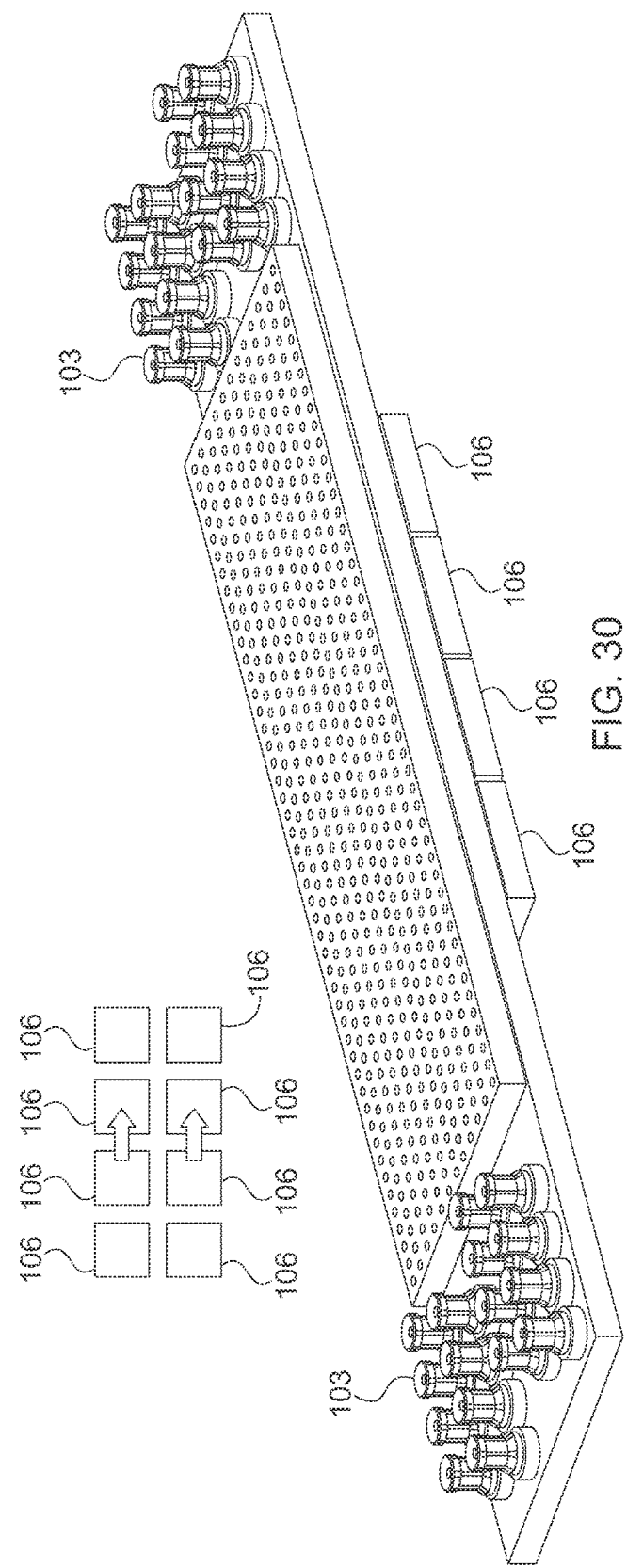

FIG. 30 shows another increase of the number of DUTs tested simultaneously, accomplished by mirroring the probe interface layer. The wafer level test interface unit 100 shows 8 devices being tested at a time, but a larger number could be implemented similarly. The routing and fanning out could also be configured to match a specific distribution of DUT on the wafer or test pattern.

Figure 31:
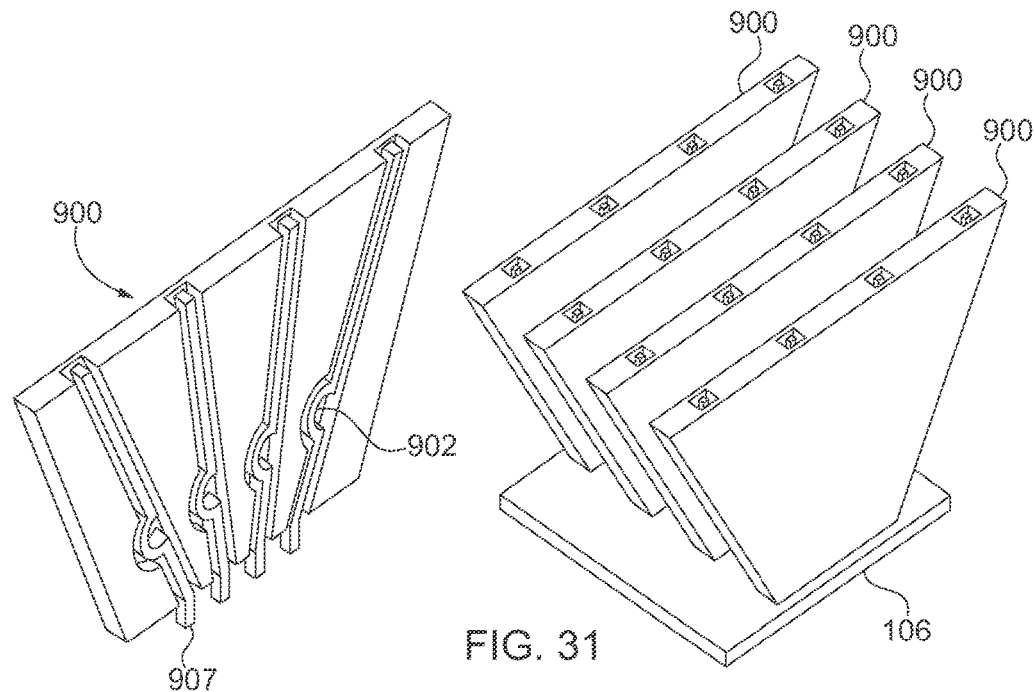
FIG. 31 schematically illustrates a vertical card prober with an integrated space transformer which routes signal lines from a smaller pitch to a larger pitch in accordance with the present invention.
Figure 32:
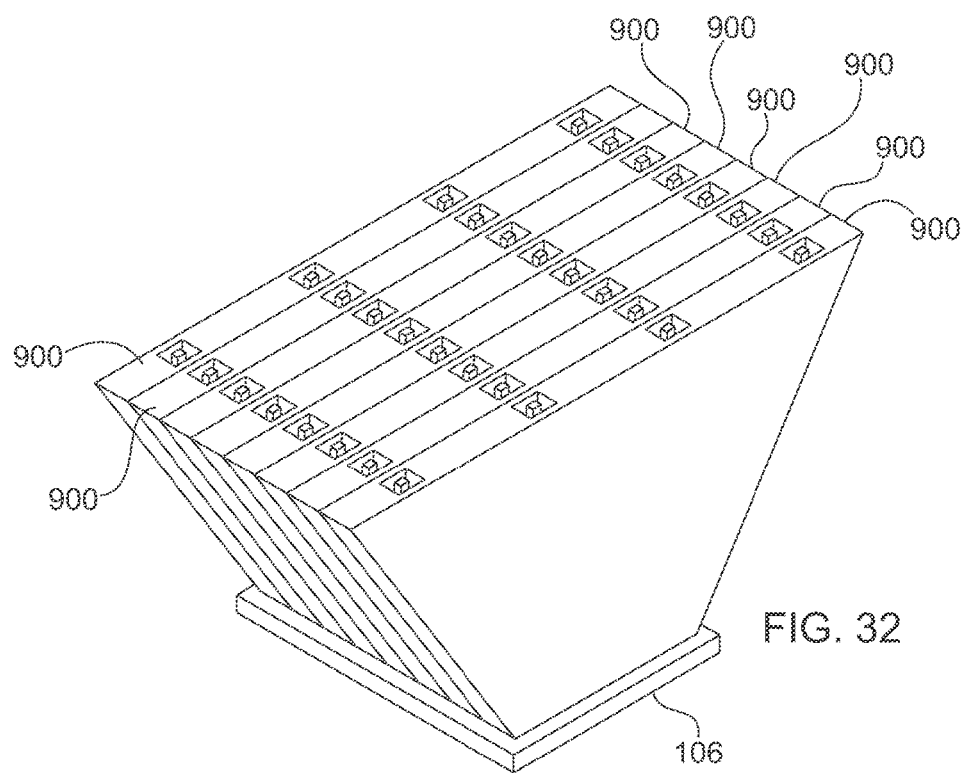
FIG. 32 schematically illustrates a stacked array of vertical card probers of the type shown in FIG. 31.
Figure 33:
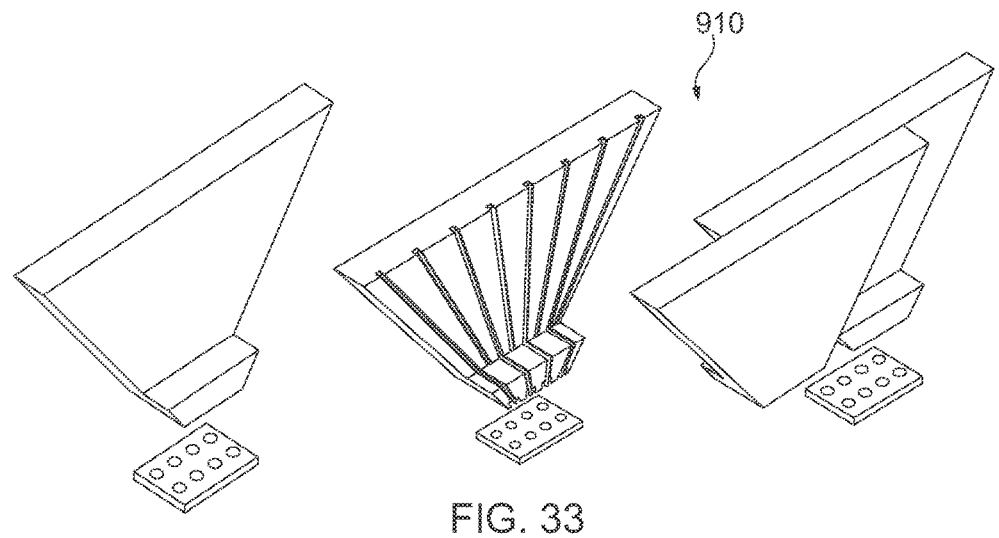
FIG. 33 schematically illustrates another vertical card prober with an integrate space transformer in accordance with the present invention.
Figure 34:
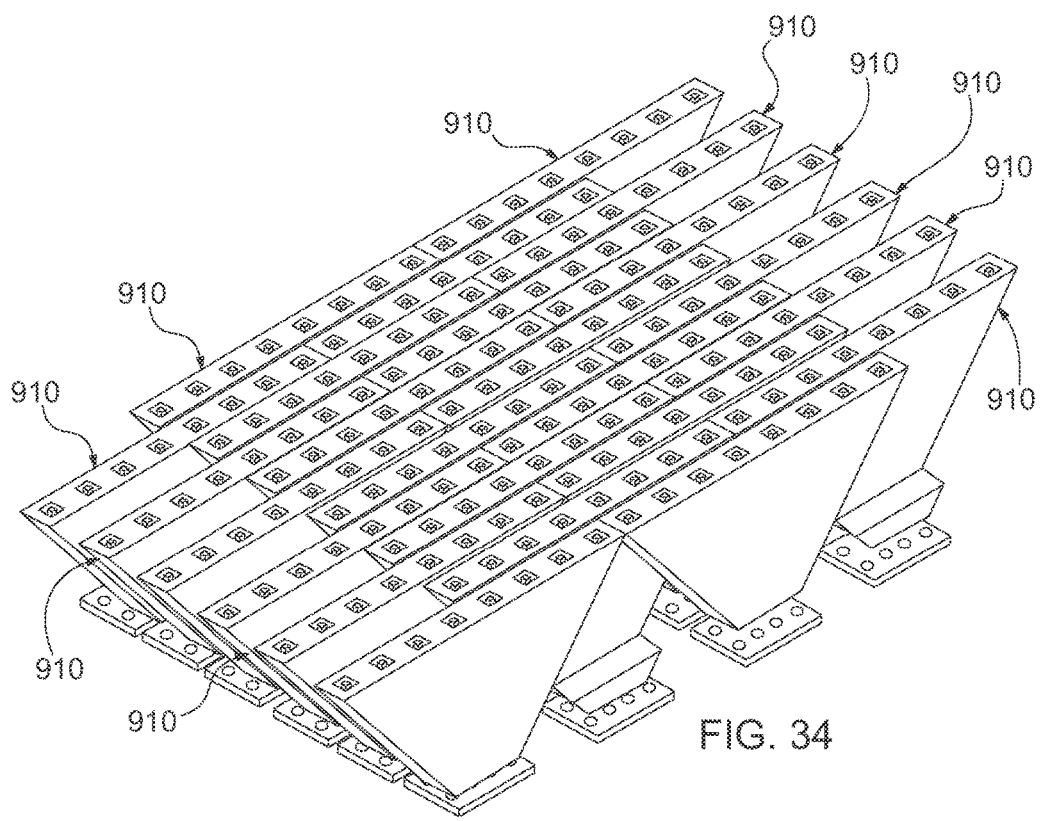
FIG. 34 schematically illustrates a stacked, interleaved array of vertical card probers of the type shown in FIG. 33.
Figure 35:
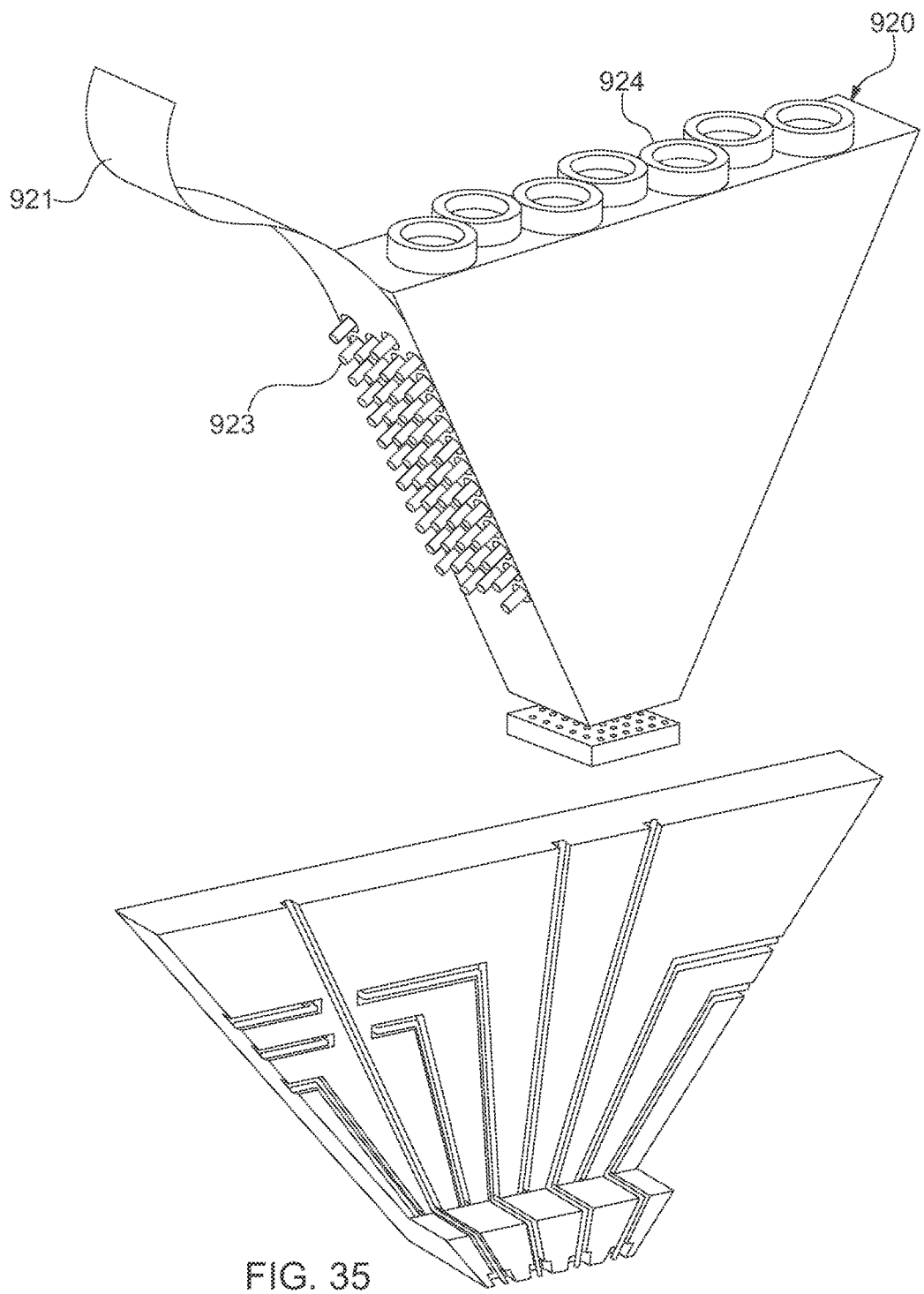
FIG. 35 schematically illustrates DC and RF routing for a tester in accordance with the present invention and could be arrayed using a staggering technique shown in FIG. 34.

FIG. 31 shows a novel configuration using a microfabricated vertical card 900 which may provide the function of one or more of, and substitute for, the contactor probe assembly 101, the probe interface layer 102, and the interposer 104 of FIG. 3. For example, the transmission lines 907 may transform the fine wiring pitch from a device under test 106 to a wider spacing for the RF or DC connector. The center conductor of coaxial transmission lines 907 may include spring portions such as 902 which may replace the spring function provided by the pogo pin 113 of the contactor probe assembly 101. Optionally, the spring portion 902 may be omitted, FIG. 33. Multiple vertical cards 900 may be assembled, such as by soldering or mechanical attachment, to create an array of vertical cards 900, FIGS. 31-34. To further assist in the routing of coaxial lines, FIG. 34 also shows a novel architecture enabled by the ability to route small diameter coax lines 901 into a common vertical space transformer (or dilation) board 910. The signal coming from either separate contactor layer as described in connection with FIG. 16 or a monolithic contactor as described in connection with FIG. 31 may be routed on only one side of the vertical space transformer 910. Routing on only one side allows staggered vertical boards 910 next to each other by switching the routing side. Using such a configuration, it is possible create an N by N testing probe array. FIG. 35 shows a novel DC and RF routing device 920 for a single chip tester or n by n tester using the staggering technique showed in FIG. 34. The DC and RF can be divided and exit 920 on different surfaces. The DC output routing 923 and the RF connector 924 may be provided on sides of the device 920.

The DC outputs 923 can be routed to a final circuit board using a flexible cable 921. The DC connector in 923 can be part of the micro-fabrication of the coax lines and be soldered to the flex-cable. This architecture allows one to improve the connector space transformer for the high density required by the device under test to the output I/Os.

Figure 36:
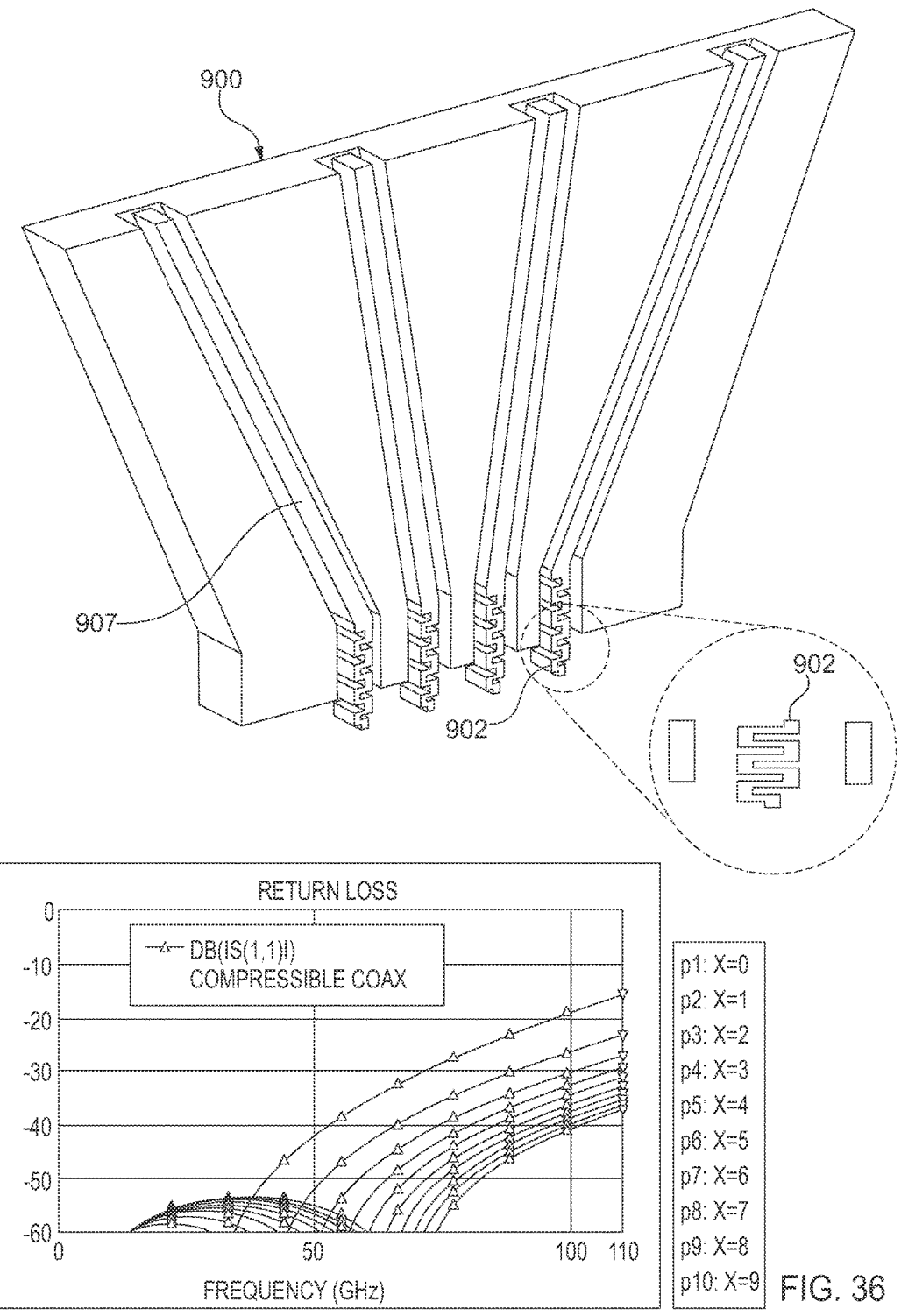
FIG. 36 schematically illustrates an exemplary probe similar in certain respects to the probe of FIG. 18 and having a spring region.

FIG. 36 illustrates an exemplary probe similar in certain respects to the probe of FIG. 18, where the common ground 900 and the center conductor 907 could include a spring in the region 902 fabricated in the PolyStrata® process which will provide the same function as the pogo pin and the probe 102 and replacing the contactor probe assembly 101. The concept presented demonstrates that meandering the center conductor while maintaining control over the OD of the meandering region allows a region that can function as a spring and as well as allow some deflection, yet still also function as a transmission line. In this case a 200 μm ID for the outer conductor is shown while the inner conductor is centered within and has a 80 μm OD. Instead of being a solid center conductor, it is made of 10 μm layers that form alternating "C" sections where each "C" is a small flexure that can deform within its elastic limits to allow compression and contact with non-planar surfaces. This example shows the "C" section of the flexure or spring region meandering only to the left and right in the picture, however meandering in and out is also possible or combining in, our, left and right to allow the flexure to deflect in any direction. Many other mechanical designs could be chosen to combine a transmission line with a spring or compliant region. To ensure such a combination of spring and transmission line can function electrically, such a structure as shown was simulated using ANSYS's HFSS and a suitably low return loss could be produced as shown despite compressing the spring. Just like finite element (FE) mechanical analysis must be done, FE electromagnetic analysis is required as the effective length, capacitance, and inductance are based on how the spring is formed and how much it is compressed. This novel approach offers very good RF matching up to 100 GHz and provides shielding of the line under test, low insertion loss and high isolation as shown in the simulated response of the test structure comprising 907, 900 and 902. This micro-fabricated spring could allow very tight pitch down to 200 nm and below.

Figure 37:
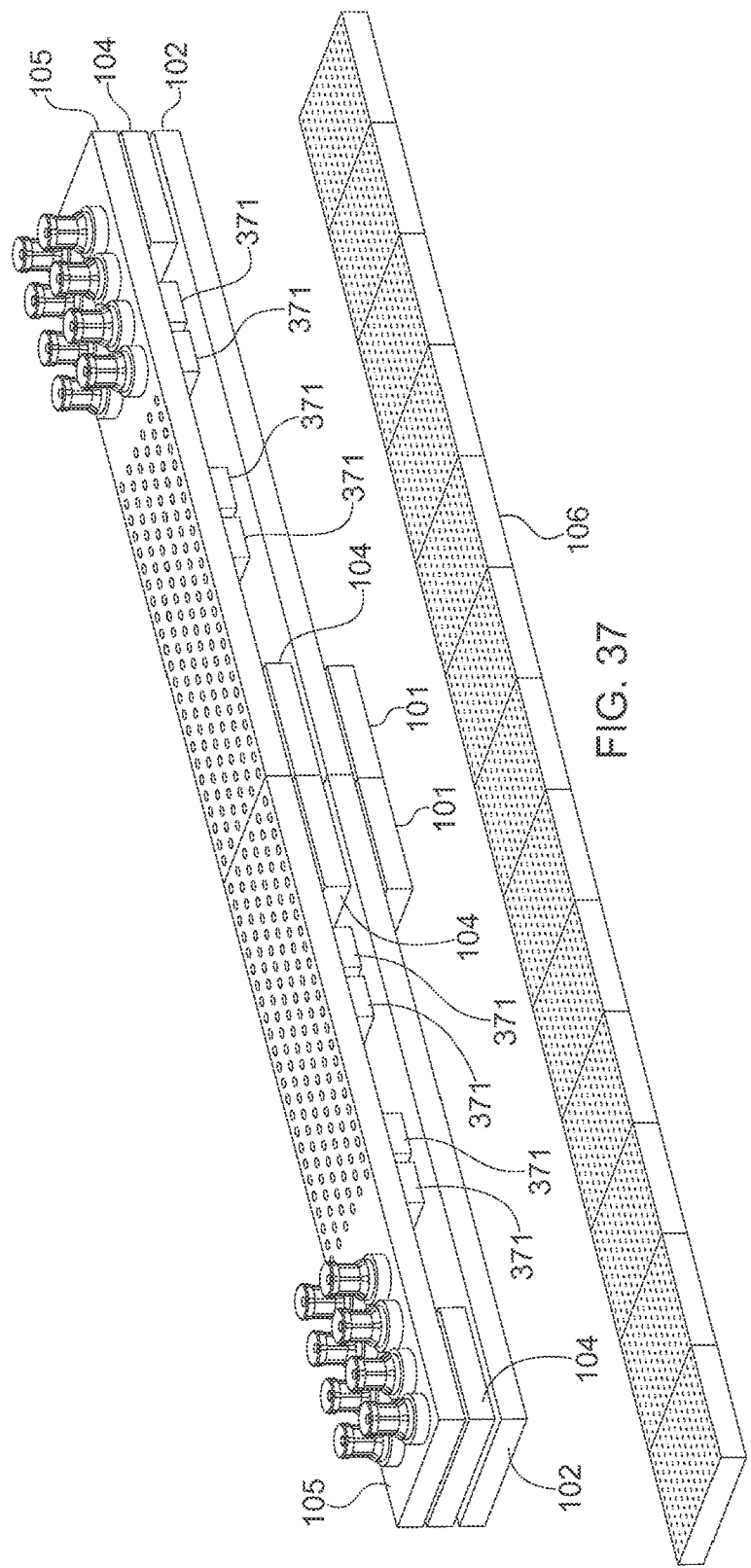
FIG. 37 schematically illustrates a wafer level test interface unit in accordance with the present invention.

FIG. 37 shows a wafer level test interface unit 100. The 3D-routing capability of the probe interface layer 102 enables clearance between the PCB 105 and the probe interface layer. This clearance permits passive or active devices 371 to be integrated on the PCB or on top of the probe interface layer 102. The ability to integrate passive devices 371 enables higher density circuits, reduces the complexity of the PCB design and/or the probe interface layer 102 and provides better testing performance of the DUT 106.

Figure 38:
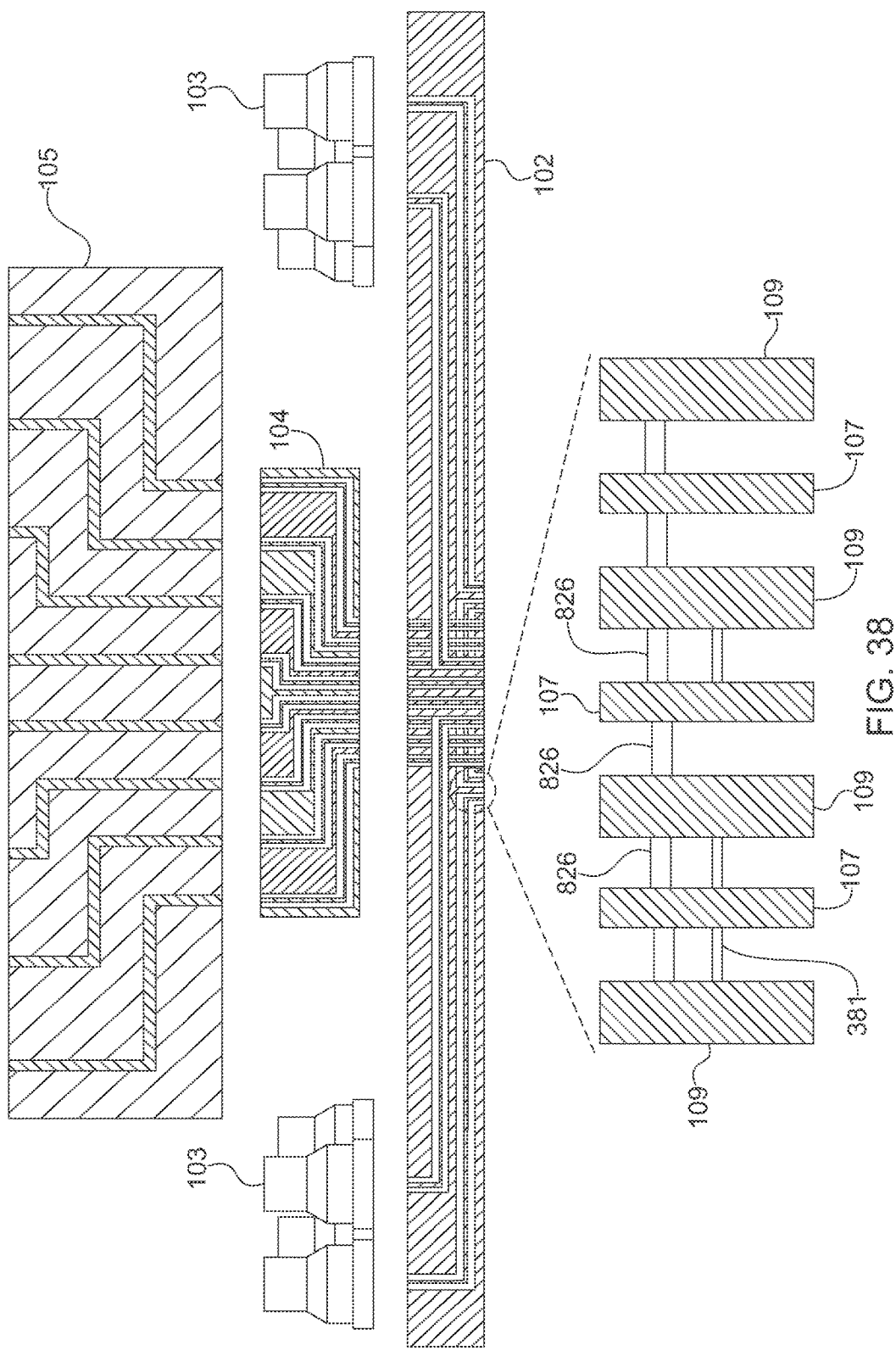
FIG. 38 schematically illustrates integration of passives components inside a coax line.

FIG. 38 shows the integration of passive components 381 such as capacitors, resistors and/or active devices such as diodes or transistors inside the coax line. The passive components can be integrated either on both sides of the center conductor 107 or on only one side between the center conductor 107 and the outer conductor 109. Inline integration on the center conductor 107 of such active or passive components 381 is also possible. The air-coax can also integrate dielectric support 826. The ability to integrate such active and/or passive components to provide tuning functions or decoupling functions for high speed digital signals is very important. The micro-integration of these components very close to the device under test offers added performance by maximizing the reduction of the parasitic effects due to the transmission lines inductance.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A wafer level test interface device, comprising a device interface layer having a plurality of coaxial transmission lines extending therethrough from a first surface of the layer to an opposing second surface of the layer, the transmission lines having respective ends spaced relative to one another at the first surface separated by a first distance and having respective ends spaced relative to one another at the second surface separated by a second distance which is larger than the first distance, wherein the coaxial transmission lines comprise a center conductor suspended in air and surrounded by conductive shielding.

2. The wafer level test interface device of claim 1, comprising a contactor probe assembly having a plurality of conductive probes extending therethrough from a first surface of the probe assembly to an opposing second surface of the probe assembly, each of the conductive probes disposed in electrical communication with a respective transmission line of the device interface layer.

3. The wafer level test interface device of claim 2, wherein the conductive probes have end portions that extend outward from the first surface of the probe assembly, and wherein the end portions are resiliently movable relative to the first surface of the probe assembly.

4. The wafer level test interface device of claim 3, wherein the conductive probes comprise one or more of a spring, MEMS, a cantilever, a flexure, a single-sided pogo pin, or a double-sided pogo pin.

5. The wafer level test interface device of claim 3, comprising a shield wall disposed between a selected pair of the end portions to minimize crosstalk between the selected pair.

6. The wafer level test interface device of claim 1, wherein the coaxial transmission lines include first end portions that extend outward from the first surface of the layer, and wherein the end portions are resiliently movable relative to the first surface of the layer.

7. The wafer level test interface device of claim 6, wherein the coaxial transmission lines include a spring configured to allow the end portions to resiliently move relative to the first surface of the layer.

8. The wafer level test interface device of claim 7, wherein the spring comprises a "C"-shape.

9. The wafer level test interface device of claim 7, wherein the spring comprises alternating "C"-shaped sections where each "C"-shaped section comprises a flexure.

10. The wafer level test interface device of claim 1, wherein the coaxial transmission lines each comprise a center conductor having a spring that allows the center conductor to resiliently move within the device interface layer.

11. The wafer level test interface device of claim 1, comprising at least one of a passive electrical component and/or active electrical component disposed within the device interface layer between a center conductor and an outer conductor of the coaxial transmission lines.

12. The wafer level test interface device of claim 1, comprising a N×M switch disposed in electrical connection with selected ones of the coaxial transmission lines.

13. A method of forming a wafer level test interface device by a sequential build process, comprising:
sequentially depositing a plurality of layers, wherein the layers comprise one or more layers of a conductive material and one or more layers of a sacrificial material, the plurality of layers collectively providing a device interface structure having a plurality of coaxial transmission lines extending therethrough from a first surface of the layer to an opposing second surface of the layer, the transmission lines comprising a center conductor suspended in an airspace and surrounded by conductive shielding and the transmission lines having respective ends spaced relative to one another at the first surface separated by a first distance and having respective ends spaced relative to one another at the second surface separated by a second distance which is larger than the first distance; and
removing the sacrificial material to provide the airspace between the center conductor and conductive shielding.

14. The wafer level test interface device of claim 1, wherein the coaxial transmission lines include, between first and second ends, an intermediate transmission line portion having a longitudinal axis associated therewith, and wherein a longitudinal axis of the first end is not parallel to the longitudinal axis of the intermediate transmission line portion.

15. The wafer level test interface device of claim 14, wherein longitudinal axis of the first end is perpendicular to the longitudinal axis of the intermediate transmission line portion.

16. The method of claim 13, wherein the coaxial transmission lines each comprise a center conductor having a spring that allows the center conductor to resiliently move within the device interface structure.

17. The method of claim 13, wherein the coaxial transmission lines include first end portions that extend outward from the first surface of the layer, and wherein the end portions are resiliently movable relative to the first surface of the layer.

18. The method of claim 17, wherein the coaxial transmission lines include a spring configured to allow the end portions to resiliently move relative to the first surface of the layer.

19. The method of claim 18, wherein the spring comprises a "C"-shape.

20. The method of claim 18, wherein the spring comprises alternating "C"-shaped sections where each "C"-shaped section comprises a flexure.

21. The method of claim 13, comprising providing at least one of a passive electrical component and/or active electrical component within the device interface structure between a selected pair of the plurality of coaxial transmission lines.

* * * * *